(12) United States Patent
Kohiki et al.

(10) Patent No.: US 10,187,983 B2
(45) Date of Patent: Jan. 22, 2019

(54) COPPER FOIL PROVIDED WITH CARRIER, LAMINATE, PRINTED WIRING BOARD, ELECTRONIC DEVICE, AND METHOD FOR FABRICATING PRINTED WIRING BOARD

(71) Applicant: JX NIPPON MINING & METALS CORPORATION, Tokyo (JP)

(72) Inventors: Michiya Kohiki, Ibaraki (JP); Tomota Nagaura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/996,768

(22) Filed: Jan. 15, 2016

(65) Prior Publication Data

US 2016/0212846 A1 Jul. 21, 2016

(30) Foreign Application Priority Data

Jan. 16, 2015 (JP) .................. 2015-006562

(51) Int. Cl.
| | | |
|---|---|---|
| H05K 1/09 | (2006.01) | |
| H05K 3/20 | (2006.01) | |
| H05K 3/02 | (2006.01) | |
| H05K 3/40 | (2006.01) | |
| H05K 3/42 | (2006.01) | |

(52) U.S. Cl.
CPC ............... *H05K 1/09* (2013.01); *H05K 3/205* (2013.01); *H05K 3/025* (2013.01); *H05K 3/4007* (2013.01); *H05K 3/421* (2013.01); *H05K 2203/0307* (2013.01)

(58) Field of Classification Search
USPC .......................... 361/748, 760, 761; 428/607
See application file for complete search history.

(56) References Cited

U.S. PATENT DOCUMENTS

| | | | |
|---|---|---|---|
| 2004/0038049 A1 | 2/2004 | Suzuki et al. | |
| 2004/0149583 A1 | 8/2004 | Kumagai et al. | |
| 2005/0158574 A1 | 7/2005 | Suzuki et al. | |
| 2011/0262722 A1* | 10/2011 | Takamori | B32B 37/0007 428/198 |

(Continued)

FOREIGN PATENT DOCUMENTS

| | | |
|---|---|---|
| CN | 1466517 A | 1/2004 |
| CN | 1620221 A | 5/2005 |

(Continued)

OTHER PUBLICATIONS

Extended European Search Report of corresponding European Patent Application No. 16151670.3, dated Nov. 13, 2017.

*Primary Examiner* — Andargie M Aychillhum

(74) *Attorney, Agent, or Firm* — Drinker Biddle & Reath LLP

(57) ABSTRACT

Provided is a copper foil provided with a carrier which enables to form an extremely fine circuit and to suppress the disconnection of a circuit well. A copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 1.5 μm or less and the number of pinholes in the ultrathin copper layer is 0 pinholes/m² or more and 5 pinholes/m² or less.

23 Claims, 6 Drawing Sheets

(56) References Cited

U.S. PATENT DOCUMENTS

2013/0216855 A1* 8/2013 Nagaura ................ B32B 15/01
                                                                                         428/607
2015/0047884 A1    2/2015 Nagaura et al.

FOREIGN PATENT DOCUMENTS

| CN | 104220250 A | 12/2014 | |
|---|---|---|---|
| EP | 1568802 A1 | 8/2005 | |
| JP | 2000269637 A | 9/2000 | |
| JP | 2002292788 A | 10/2002 | |
| JP | 2004107786 A | 4/2004 | |
| JP | 2004137588 A | 5/2004 | |
| JP | 5373993 B1 * | 12/2013 | .............. H05K 1/09 |
| KR | 20140128271 | 11/2014 | |
| TW | 201433220 A | 8/2014 | |
| TW | 201439378 A | 10/2014 | |

* cited by examiner

EXPOSURE AND DEVELOPMENT

CIRCUIT PLATING AND RESIST REMOVAL

RESIN AND COPPER FOIL PROVIDED WITH A CARRIER LAMINATION

RELEASE OF SECOND LAYER OF CARRIER FOIL

LASER HOLE OPENING

VIA FILL

SECOND LAYER CIRCUIT PLATING

RELEASE OF FIRST LAYER CARRIER FOIL

FLASH ETCHING

BUMP AND COPPER PILLAR FORMATION

FIG. 6

| Focus position of photomicrograph | Without residue | With residue |
|---|---|---|
| Top surface | | |
| Bottom surface | | |

COPPER FOIL PROVIDED WITH CARRIER, LAMINATE, PRINTED WIRING BOARD, ELECTRONIC DEVICE, AND METHOD FOR FABRICATING PRINTED WIRING BOARD

TECHNICAL FIELD

The present invention relates to a copper foil provided with a carrier, a laminate, a printed wiring board, an electronic device, and a method for fabricating a printed wiring board.

In general, a printed wiring board is fabricated through steps in which an insulating substrate is adhered to a copper foil to make a copper-clad laminate and a conductive pattern is formed on the copper foil surface by etching. High-density implementation of mounted components and handling of signals at higher frequencies have been progressed along with the increase of the recent needs for smaller electronic devices with a higher performance, and printed wiring boards are needed to have a fine conductive pattern (fine pitch) and to deal with high frequencies.

Recently, while a copper foil having a thickness of 9 µm or less, or even a thickness of 5 µm or less has been required to cope with a fine pitch, such an ultrathin copper foil has a low mechanical strength, and is likely to tear or generate a wrinkle in fabricating a printed wiring board. Accordingly, a copper foil provided with a carrier has been developed in which an ultrathin copper layer is electrodeposited above a thick metal foil, which is utilized for a carrier, with a peel layer sandwiched therebetween. The surface of the ultrathin copper layer is pasted on an insulating substrate to heat and pressure-bond, and thereafter the carrier is peeled off and removed via the peel layer. A fine circuit is formed by using a method (MSAP: Modified-Semi-Additive-Process) in which a circuit pattern is formed with a resist on the exposed ultrathin copper layer and the ultrathin copper layer is then etching-removed with a sulfuric acid-hydrogen peroxide etchant.

In addition, pinholes are likely to be generated in the surface of the ultrathin copper layer of a copper foil provided with a carrier due to the thinness. The generation of such pinholes may cause the disconnection of a circuit. Examples of a technique to suppress the disconnection of a circuit include Japanese Patent Laid-Open No. 2004-107786 (Patent Literature 1) and Japanese Patent Laid-Open No. 2004-137588 (Patent Literature 2).

CITATION LIST

Patent Literature

Patent Literature 1 Japanese Patent Laid-Open No. 2004-107786
Patent Literature 2 Japanese Patent Laid-Open No. 2004-137588

SUMMARY OF INVENTION

Technical Problem

For the above reason or the like, there are required formation of a fine circuit using a copper foil provided with a carrier, particularly a technique to form an extremely fine circuit using the MSAP, and in addition a technique to suppress the disconnection of a circuit well are required. Accordingly, it is the object of the present invention to provide a copper foil provided with a carrier which enables to form an extremely fine circuit and to suppress the disconnection of a circuit well.

Solution to Problem

As a result of diligent research to achieve the above object, the present inventors discovered a technique to control the thickness of an ultrathin copper layer in a copper foil provided with a carrier to a thickness of 1.5 µm or less, which is extremely smaller than that of a conventional one, and to suppress the generation of pinholes in the ultrathin copper layer well even in the small thickness, which enables to form an extremely fine circuit and to suppress the disconnection of a circuit well.

The present invention, which was completed based on the above knowledge, is, in one aspect, a copper foil provided with a carrier having, in order, an intermediate layer and an ultrathin copper layer on one side or both sides of the carrier, wherein the ultrathin copper layer is an electrolytic copper layer; and a thickness of the ultrathin copper layer measured by using a gravimetric method is 1.5 µm or less and a number of pinholes in the ultrathin copper layer is 0 pinholes/m$^2$ or more and 5 pinholes/m$^2$ or less.

The present invention is, in another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is less than 1.0 µm and the number of pinholes in the ultrathin copper layer is 0 pinholes/m$^2$ or more and 10 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.9 µm or less and the number of pinholes in the ultrathin copper layer is 0 pinholes/m$^2$ or more and 15 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.8 µm or less and the number of pinholes in the ultrathin copper layer is 0 pinholes/m$^2$ or more and 17 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.7 µm or less and the number of pinholes in the ultrathin copper layer is 0 pinholes/m$^2$ or more and 20 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.65 µm or less and the number of pinholes in the ultrathin copper layer is 0 pinholes/m$^2$ or more and 20 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.60 µm or less and the number of pinholes in the ultrathin copper layer is 0 pinholes/m$^2$ or more and 23 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.55 µm or less and the number of pinholes in the ultrathin copper layer is 0 pinholes/m$^2$ or more and 25 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.50 µm or less and the number of pinholes in the ultrathin copper layer is 0 pinholes/m$^2$ or more and 27 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.45 µm or less and the number of pinholes in the ultrathin copper layer is 0 pinholes/m$^2$ or more and 30 pinholes/m$^2$ or less.

The present invention is, in yet another aspect, a copper foil provided with a carrier having, in order, an intermediate layer and an ultrathin copper layer on one side or both sides of the carrier, wherein the ultrathin copper layer is an electrolytic copper layer; and the thickness of the ultrathin copper layer measured by using a gravimetric method is 0.40 µm or less and the number of pinholes in the ultrathin copper layer is 0 pinholes/m$^2$ or more and 30 pinholes/m$^2$ or less.

In an embodiment of the copper foil provided with a carrier according to the present invention, the thickness of the ultrathin copper layer measured by using a gravimetric method is 0.10 µm or more.

In another embodiment of the copper foil provided with a carrier according to the present invention, the thickness of the ultrathin copper layer measured by using the gravimetric method is 0.15 µm or more.

In yet another embodiment of the copper foil provided with a carrier according to the present invention, the thickness of the ultrathin copper layer measured by using the gravimetric method is 0.15 to 0.85 µm.

In yet another embodiment of the copper foil provided with a carrier according to the present invention, the number of pinholes in the ultrathin copper layer is 0 pinholes/m$^2$ or more and 5 pinholes/m$^2$ or less.

In yet another embodiment of the copper foil provided with a carrier according to the present invention, the ultrathin copper layer has a gloss copper plating layer.

In yet another embodiment of the copper foil provided with a carrier according to the present invention, the ultrathin copper layer is a gloss copper plating layer.

In yet another embodiment of the present invention, the copper foil provided with a carrier has a roughened layer on at least one surface or both surfaces of the ultrathin copper layer and the carrier.

In yet another embodiment of the present invention, the roughened layer is a layer consisting of a simple substance selected from the group consisting of copper, nickel, cobalt, phosphorous, tungsten, arsenic, molybdenum, chromium and zinc, or an alloy containing one or more thereof.

In yet another embodiment of the present invention, the copper foil provided with a carrier includes a resin layer on the surface of the roughened layer.

In yet another embodiment of the present invention, the copper foil provided with a carrier has one or more layers selected from the group consisting of a heat resistant layer, an anti-corrosion layer, a chromate-treated layer and a silane coupling-treated layer on the surface of the roughened layer.

In yet another embodiment of the present invention, the copper foil provided with a carrier has one or more layers selected from the group consisting of a heat resistant layer, an anti-corrosion layer, a chromate-treated layer and a silane coupling-treated layer on at least one surface or both surfaces of the ultrathin copper layer and the carrier.

In yet another embodiment of the present invention, the copper foil provided with a carrier includes a resin layer provided above one or more layers selected from the group consisting of the heat resistant layer, an anti-corrosion layer, a chromate-treated layer and a silane coupling-treated layer.

In yet another embodiment of the present invention, the copper foil provided with a carrier includes a resin layer provided above the ultrathin copper layer.

In yet another embodiment of the present invention, the resin layer is a resin for adhesion.

In yet another embodiment of the present invention, the resin layer is a resin in a semi-cured state.

The present invention is, in another aspect, a laminate fabricated by using the copper foil provided with a carrier according to the present invention.

The present invention is, in yet another aspect, is a laminate including the copper foil provided with a carrier according to the present invention and a resin, wherein a part or all of an edge face of the copper foil provided with a carrier is covered with the resin.

The present invention is, in yet another aspect, a printed wiring board fabricated by using the copper foil provided with a carrier according to the present invention.

The present invention is, in yet another aspect, an electronic device using the printed wiring board according to the present invention.

In yet another aspect, the present invention is a method for fabricating a printed wiring board including:
  forming a copper-clad laminate by carrying out
    a step of preparing the copper foil provided with a carrier according to the present invention and an insulating substrate,
    a step of laminating the copper foil provided with a carrier and the insulating substrate, and
    a step of, after the copper foil provided with a carrier and the insulating substrate have been laminated, peeling the carrier of the copper foil provided with a carrier; and
  then forming a circuit by any of a semi-additive method, a subtractive method, a partly additive method, and a modified semi-additive method.

In yet another aspect, the present invention is a method for fabricating a printed wiring board including:
  a step of forming a circuit on the ultrathin copper layer side surface or the carrier side surface of the copper foil provided with a carrier according to the present invention;
  a step of forming a resin layer on the ultrathin copper layer side surface or the carrier side surface of the copper foil provided with a carrier so that the circuit is buried;

a step of forming a circuit on the resin layer;

a step of peeling the carrier or the ultrathin copper layer after forming the circuit on the resin layer;

and a step of exposing the circuit buried in the resin layer that is formed on the ultrathin copper layer side surface or the carrier side surface by, after the carrier or the ultrathin copper layer has been peeled off, removing the ultrathin copper layer or the carrier.

In yet another aspect, the present invention is a method for fabricating a printed wiring board including:

a step of laminating the ultrathin copper layer side surface and/or the carrier side surface of the copper foil provided with a carrier according to the present invention and a resin substrate;

a step of providing two layers of a resin layer and a circuit at least one time on the ultrathin copper layer side surface and/or the carrier side surface of the copper foil provided with a carrier opposite to a side with the resin substrate laminated thereon;

and a step of, after the two layers of the resin layer and the circuit have been formed, peeling the carrier or the ultrathin copper layer from the copper foil provided with a carrier.

Advantageous Effects of Invention

According to the present invention, a copper foil provided with a carrier can be provided which enables to form an extremely fine circuit and to suppress the disconnection of a circuit well.

BRIEF DESCRIPTION OF DRAWINGS

FIG. 6 is an example of photomicrographs of the appearance of the upper side in relation to evaluation of wirability (wiring formation ability).

DESCRIPTION OF EMBODIMENTS

Copper Foil Provided with Carrier

Figure 1:
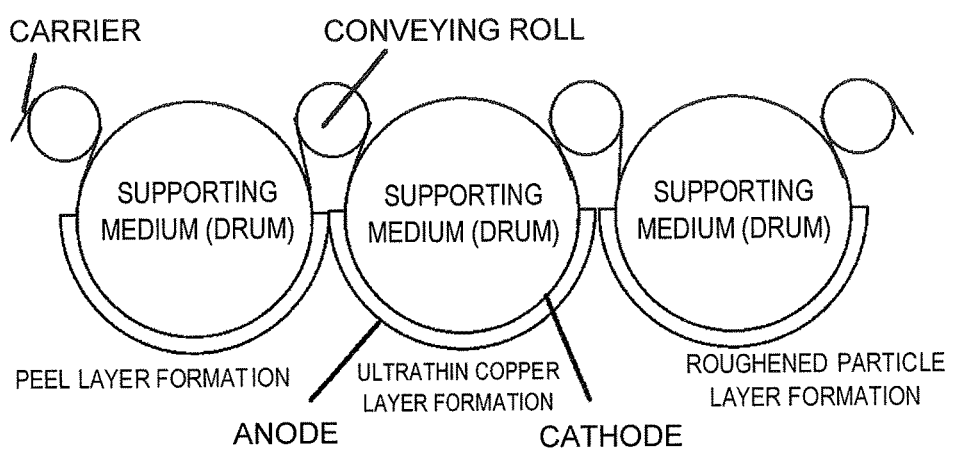
FIG. 1 is a schematic view illustrating a foil-conveying system according to the method for fabricating a copper foil provided with a carrier according to an embodiment of the present invention.

The copper foil provided with a carrier according to the present invention has, in order, an intermediate layer and an ultrathin copper layer on one side or both sides of the carrier. Methods for using a copper foil provided with a carrier itself are well known to those skilled in the art. For example, the surface of an ultrathin copper layer is pasted on an insulating substrate such as a paper substrate phenolic resin, a paper substrate epoxy resin, a synthetic fiber fabric substrate epoxy resin, a glass cloth-paper composite substrate epoxy resin, a glass cloth-glass non-woven composite substrate epoxy resin, and a glass cloth substrate epoxy resin, a polyester film and a polyimide film followed by heating and pressure-bonding; the carrier is then peeled off; the ultrathin copper layer adhered to the insulating substrate is etched in an intended conductive pattern; and eventually a laminate (a copper-clad laminate or the like), a printed wiring board or the like can be fabricated.

Alternatively, after an intermediate layer and an ultrathin copper layer are temporally provided on both sides of the carrier, the ultrathin copper layers on both sides may be subjected to a surface treatment such as a roughening treatment simultaneously. Further, after an intermediate layer and an ultrathin copper layer are provided on one side of the carrier and then the ultrathin copper layer is subjected to a surface treatment such as a roughening treatment, an intermediate layer and an ultrathin copper layer may be provided on the other side and then the ultrathin copper layer may be subjected to a surface treatment such as a roughening treatment. In this case, after the surface of the surface-treated ultrathin copper layer provided on one side of the carrier is protected with a masking tape, a masking film or the like, the other side may be provided with an intermediate layer, an ultrathin copper layer and a surface treatment such as a roughening treatment.

Carrier

Carriers that can be used in the present invention are provided typically in the form of a metal foil such as a rolled copper foil and an electrolytic copper foil, or a resin film. Commonly, an electrolytic copper foil is fabricated by electrolytic deposition of copper on a titanium or stainless steel drum from a copper sulfate plating bath, and a rolled copper foil is fabricated by repeating plastic working and heat treatment with a mill roll. As the material for the rolled copper foil, in addition to high-purity copper, such as tough pitch copper (JIS H3100 alloy number C1100) and oxygen-free copper (JIS H3100 alloy number C1020 or JIS H3510 alloy number C1011), for example, copper alloys can also be used, such as Sn-containing copper, Ag-containing copper, a copper alloy to which Cr, Zr, Mg, or the like has been added, or a Colson copper alloy to which Ni, Si, and the like has been added. Note that, when the term "copper foil" is used singly herein, a copper alloy foil is also included therein. As the resin film, an insulating resin film, a polyimide film, an LCP film or the like can be used.

Although the thickness of the carrier that can be used in the present invention is not especially limited, the carrier may be appropriately adjusted to a suitable thickness in view its role as a carrier, such as, for example, 5 µm or more. However, since production costs increase if the carrier is too thick, generally it is preferred that the thickness is 35 µm or less. Therefore, the thickness of the carrier is typically 8 to 70 µm, more typically 12 to 70 µm, and more typically 18 to 35 µm. From the perspective of reducing the raw material costs, the thickness of the carrier is preferably small. Therefore, the thickness of the carrier is typically 5 μm or more and 35 μm or less, preferably 5 μm or more and 18 μm or less, preferably 5 μm or more and 12 μm or less, preferably 5 μm or more and 11 μm or less, and preferably 5 μm or more and 10 μm or less. In the case that the thickness of the carrier is small, a crease easily generates during conveying the carrier in a foil. In order to prevent the generation of a crease, for example, it is effective to smooth the conveying rolls in apparatus for fabricating a copper foil provided with a carrier and to reduce the distance between one conveying roll and the next one.

An example of fabrication conditions in the case that an electrolytic copper foil is used as the carrier will be shown in the following.

Electrolyte Composition
Copper: 90 to 110 g/L
Sulfuric acid: 90 to 110 g/L
Chlorine: 50 to 100 ppm
Leveling agent 1 (bis(3-sulfopropyl)disulfide): 10 to 30 ppm
Leveling agent 2 (amine compound): 10 to 30 ppm
An amine compound represented by the following chemical formula can be used for the above amine compound.

Further, unless otherwise noted, the balance of an electrolyte, a plating solution or the like described in the present invention is water.

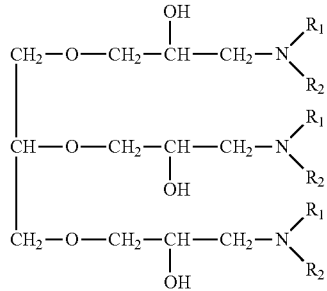

wherein $R_1$ and $R_2$ are selected from the group consisting of a hydroxyalkyl group, an ether group, an aryl group, an aromatic-substituted alkyl group, an unsaturated hydrocarbon group, and an alkyl group.

Fabrication Conditions
Current density: 70 to 100 A/dm$^2$
Electrolyte temperature: 50 to 60° C.
Electrolyte linear speed: 3 to 5 m/sec
Electrolysis time: 0.5 to 10 minutes
Intermediate Layer The intermediate layer is provided on one side or both sides of the carrier. Another layer may also be provided between the carrier and the intermediate layer. The intermediate layer used in the present invention is not especially limited, as long as the configuration of the copper foil provided with a carrier is such that the ultrathin copper layer does not easily peel from the carrier before the lamination step onto an insulating substrate, and such that the ultrathin copper layer can peel from the carrier after the lamination step onto the insulating substrate. For example, the intermediate layer of the copper foil provided with a carrier according to the present invention may include one or two or more selected from the group consisting of Cr, Ni, Co, Fe, Mo, Ti, W, P, Cu, Al, and Zn, alloys thereof, hydrates thereof, oxides thereof, and organic substances. Further, a plurality of intermediate layers may be provided.

In addition, for example, the intermediate layer can be configured from the carrier side from a single metal layer formed from one element selected from the group of elements consisting of Cr, Ni, Co, Fe, Mo, Ti, W, P, Cu, Al, and Zn, or, configured by forming an alloy layer formed from one or two or more elements selected from the group of elements consisting of Cr, Ni, Co, Fe, Mo, Ti, W, P, Cu, Al, and Zn, and forming above that layer a layer formed from a hydrate or an oxide or an organic substance of one or two or more elements selected from the group of elements consisting of Cr, Ni, Co, Fe, Mo, Ti, W, P, Cu, Al, and Zn.

In addition, for example, the intermediate layer can be configured from the carrier side from a single metal layer formed from any one element selected from the group of elements consisting of Cr, Ni, Co, Fe, Mo, Ti, W, P, Cu, Al, and Zn, or, configured by forming an alloy layer formed from one or more elements selected from the group of elements consisting of Cr, Ni, Co, Fe, Mo, Ti, W, P, Cu, Al, and Zn, or an organic substance layer and subsequently forming a single metal layer formed from any one element selected from the group of elements consisting of Cr, Ni, Co, Fe, Mo, Ti, W, P, Cu, Al, and Zn or an alloy layer formed from one or more elements selected from the group of elements consisting of Cr, Ni, Co, Fe, Mo, Ti, W, P, Cu, Al, and Zn. Further, a layer configuration which can be used as the intermediate layer may be used for the other layer.

If the intermediate layer is provided on just one side, it is preferred to provide an anti-corrosion layer such, as a Ni plating layer, on the opposite face of the carrier. In the case that the intermediate layer is provided by using a chromate treatment, a zinc chromate treatment or a plating treatment, it is believed that a part of the metals attached such as chromium and zinc may be in a state of a hydrate or an oxide.

Further, for example, the intermediate layer can be configured by laminating nickel, a nickel-phosphorus alloy, or a nickel-cobalt alloy, and chromium, in that order, on the carrier. Since the adhesive strength between nickel and copper is higher than the adhesive strength between chromium and copper, when the ultrathin copper layer is peeled, the peeling occurs at the interface between the ultrathin copper layer and chromium. Further, the nickel in the intermediate layer can be expected to provide a barrier effect that prevents the diffusion of the copper component from the carrier into the ultrathin copper layer. The amount of nickel deposited in the intermediate layer is preferably 100 μg/dm$^2$ or more and 40,000 μg/dm$^2$ or less, more preferably 100 μg/dm$^2$ or more and 4,000 μg/dm$^2$ or less, more preferably 100 μg/dm$^2$ or more and 2,500 μg/dm$^2$ or less, and more preferably 100 μg/dm$^2$ or more and less than 1,000 μg/dm$^2$. The amount of chromium deposited in the intermediate layer is preferably 5 μg/dm$^2$ or more and 100 μg/dm$^2$ or less. If the intermediate layer is provided on just one side, it is preferred to provide an anti-corrosion layer, such as a Ni plating layer, on the opposite face of the carrier.

The intermediate layer can be provided by performing for the carrier a wet plating such as an electroplating, an electroless plating and an immersion plating. In the case that a resin film is used for the carrier, it is necessary to perform a pretreatment such as an activation treatment for subjecting the carrier to a wet plating before formation of the intermediate layer. The above-described pretreatment which can be used may be any treatment as long as a wet plating can be performed for a resin film, and known treatments can be used.

Ultrathin Copper Layer

The ultrathin copper layer is provided above the intermediate layer. Another layer may also be provided between the intermediate layer and the ultrathin copper layer. The ultrathin copper layer may be provided on both sides of the carrier. The ultrathin copper layer is an electrolytic copper layer. Here, the electrolytic copper layer refers to a copper layer formed by using an electroplating (electrolytic plating). The ultrathin copper layer can be formed through an electroplating utilizing an electrolytic bath of copper sulfate, copper pyrophosphate, copper sulfamate, copper cyanide or the like, and a copper sulfate bath is preferred because it is used for a common electrolytic copper layer and enables to form a copper foil at a high current density. The thickness of the ultrathin copper layer measured by using the gravimetric method according to the present invention is controlled to 1.5 µm or less. This configuration enables to form an extremely fine circuit using the ultrathin copper layer. The thickness of the ultrathin copper layer measured by using the gravimetric method according to the present invention is preferably 1.2 µm or less, more preferably 1.1 µm or less, more preferably 1.0 µm or less, more preferably less than 1.0 µm, more preferably 0.9 µm or less, more preferably 0.8 µm or less, more preferably 0.7 µm or less, more preferably 0.65 µm or less, more preferably 0.60 µm or less, more preferably 0.55 µm or less, more preferably 0.50 µm or less, more preferably 0.45 µm or less, and more preferably 0.40 µm or less. The thickness of the ultrathin copper layer measured by using the gravimetric method according to the present invention is preferably 0.01 µm or more, preferably 0.05 µm or more, preferably 0.10 µm or more, and more preferably 0.15 µm or more because in the case of being too small, a problem of difficulty in handling may occur. The thickness of the ultrathin copper layer measured by using the gravimetric method according to the present invention is typically 0.01 to 1.00 µm, typically 0.05 to 0.95 µm, and more typically 0.15 to 0.85 µm.

The number of pinholes in the ultrathin copper layer according to the present invention is controlled to be within the following range depending on the thickness of the ultrathin copper layer. This configuration enables to suppress the generation of disconnection well even when a fine circuit is formed.

In one aspect of the ultrathin copper layer according to the present invention, the thickness of the ultrathin copper layer is 1.5 µm or less and the number of pinholes in the ultrathin copper layer is controlled to 0 pinholes/m$^2$ or more and 5 pinholes/m$^2$ or less, is preferably 0 pinholes/m$^2$ or more and 4 pinholes/m$^2$ or less, more preferably 0 pinholes/m$^2$ or more and 3 pinholes/m$^2$ or less, more preferably 0 pinholes/m$^2$ or more and 2 pinholes/m$^2$ or less, and more preferably 0 pinholes/m$^2$ or more and 1 pinhole/m$^2$ or less.

In another aspect of the ultrathin copper layer according to the present invention, the thickness of the ultrathin copper layer is less than 1.0 µm and the number of pinholes in the ultrathin copper layer is controlled to 0 pinholes/m$^2$ or more and 10 pinholes/m$^2$ or less, is preferably 0 pinholes/m$^2$ or more and 9 pinholes/m$^2$ or less, more preferably 0 pinholes/m$^2$ or more and 8 pinholes/m$^2$ or less, more preferably 0 pinholes/m$^2$ or more and 7 pinholes/m$^2$ or less, more preferably 0 pinholes/m$^2$ or more and 6 pinholes/m$^2$ or less, more preferably 0 pinholes/m$^2$ or more and 5 pinholes/m$^2$ or less, more preferably 0 pinholes/m$^2$ or more and 3 pinholes/m$^2$ or less, more preferably 0 pinholes/m$^2$ or more and 2 pinholes/m$^2$ or less, and more preferably 0 pinholes/m$^2$ or more and 1 pinhole/m$^2$ or less.

In yet another aspect of the ultrathin copper layer according to the present invention, the thickness of the ultrathin copper layer is 0.9 µm or less and the number of pinholes in the ultrathin copper layer is controlled to 0 pinholes/m$^2$ or more and 15 pinholes/m$^2$ or less, is preferably 0 pinholes/m$^2$ or more and 13 pinholes/m$^2$ or less, more preferably 0 pinholes/m$^2$ or more and 11 pinholes/m$^2$ or less, more preferably 0 pinholes/m$^2$ or more and 10 pinholes/m$^2$ or less, more preferably 0 pinholes/m$^2$ or more and 7 pinholes/m$^2$ or less, more preferably 0 pinholes/m$^2$ or more and 5 pinholes/m$^2$ or less, more preferably 0 pinholes/m$^2$ or more and 3 pinholes/m$^2$ or less, more preferably 0 pinholes/m$^2$ or more and 2 pinholes/m$^2$ or less, and more preferably 0 pinholes/m$^2$ or more and 1 pinhole/m$^2$ or less.

In yet another aspect of the ultrathin copper layer according to the present invention, the thickness of the ultrathin copper layer is 0.8 µm or less and the number of pinholes in the ultrathin copper layer is controlled to 0 pinholes/m$^2$ or more and 17 pinholes/m$^2$ or less, is preferably 0 pinholes/m$^2$ or more and 15 pinholes/m$^2$ or less, more preferably 0 pinholes/m$^2$ or more and 13 pinholes/m$^2$ or less, more preferably 0 pinholes/m$^2$ or more and 11 pinholes/m$^2$ or less, more preferably 0 pinholes/m$^2$ or more and 9 pinholes/m$^2$ or less, more preferably 0 pinholes/m$^2$ or more and 5 pinholes/m$^2$ or less, more preferably 0 pinholes/m$^2$ or more and 3 pinholes/m$^2$ or less, more preferably 0 pinholes/m$^2$ or more and 2 pinholes/m$^2$ or less, and more preferably 0 pinholes/m$^2$ or more and 1 pinhole/m$^2$ or less.

In yet another aspect of the ultrathin copper layer according to the present invention, the thickness of the ultrathin copper layer is 0.7 µm or less and the number of pinholes in the ultrathin copper layer is controlled to 0 pinholes/m$^2$ or more and 20 pinholes/m$^2$ or less, is preferably 0 pinholes/m$^2$ or more and 18 pinholes/m$^2$ or less, more preferably 0 pinholes/m$^2$ or more and 16 pinholes/m$^2$ or less, more preferably 0 pinholes/m$^2$ or more and 14 pinholes/m$^2$ or less, more preferably 0 pinholes/m$^2$ or more and 12 pinholes/m$^2$ or less, more preferably 0 pinholes/m$^2$ or more and 5 pinholes/m$^2$ or less, more preferably 0 pinholes/m$^2$ or more and 3 pinholes/m$^2$ or less, more preferably 0 pinholes/m$^2$ or more and 2 pinholes/m$^2$ or less, and more preferably 0 pinholes/m$^2$ or more and 1 pinhole/m$^2$ or less.

In yet another aspect of the ultrathin copper layer according to the present invention, the thickness of the ultrathin copper layer is 0.65 µm or less and the number of pinholes in the ultrathin copper layer is controlled to 0 pinholes/m$^2$ or more and 20 pinholes/m$^2$ or less, is preferably 0 pinholes/m$^2$ or more and 18 pinholes/m$^2$ or less, more preferably 0 pinholes/m$^2$ or more and 16 pinholes/m$^2$ or less, more preferably 0 pinholes/m$^2$ or more and 14 pinholes/m$^2$ or less, more preferably 0 pinholes/m$^2$ or more and 12 pinholes/m$^2$ or less, more preferably 0 pinholes/m$^2$ or more and 5 pinholes/m$^2$ or less, more preferably 0 pinholes/m$^2$ or more and 3 pinholes/m$^2$ or less, more preferably 0 pinholes/m$^2$ or more and 2 pinholes/m$^2$ or less, and more preferably 0 pinholes/m$^2$ or more and 1 pinhole/m$^2$ or less.

In yet another aspect of the ultrathin copper layer according to the present invention, the thickness of the ultrathin copper layer is 0.60 µm or less and the number of pinholes in the ultrathin copper layer is controlled to 0 pinholes/m$^2$ or more and 23 pinholes/m$^2$ or less, is preferably 0 pinholes/m$^2$ or more and 20 pinholes/m$^2$ or less, more preferably 0 pinholes/m$^2$ or more and 17 pinholes/m$^2$ or less, more preferably 0 pinholes/m$^2$ or more and 14 pinholes/m$^2$ or less, more preferably 0 pinholes/m$^2$ or more and 11 pinholes/m$^2$ or less, more preferably 0 pinholes/m$^2$ or more and 5 pinholes/m$^2$ or less, more preferably 0 pinholes/m$^2$ or more and 3 pinholes/m² or less, more preferably 0 pinholes/m² or more and 2 pinholes/m² or less, and more preferably 0 pinhole/m² or more and 1 pinhole/m² or less.

In yet another aspect of the ultrathin copper layer according to the present invention, the thickness of the ultrathin copper layer is 0.55 μm or less and the number of pinholes in the ultrathin copper layer is controlled to 0 pinholes/m² or more and 25 pinholes/m² or less, is preferably 0 pinholes/m² or more and 22 pinholes/m² or less, more preferably 0 pinholes/m² or more and 19 pinholes/m² or less, more preferably 0 pinholes/m² or more and 16 pinholes/m² or less, more preferably 0 pinholes/m² or more and 13 pinholes/m² or less, more preferably 0 pinholes/m² or more and 5 pinholes/m² or less, more preferably 0 pinholes/m² or more and 3 pinholes/m² or less, more preferably 0 pinholes/m² or more and 2 pinholes/m² or less, and more preferably 0 pinholes/m² or more and 1 pinhole/m² or less.

In yet another aspect of the ultrathin copper layer according to the present invention, the thickness of the ultrathin copper layer is 0.50 μm or less and the number of pinholes in the ultrathin copper layer is controlled to 0 pinholes/m² or more and 27 pinholes/m² or less, is preferably 0 pinholes/m² or more and 24 pinholes/m² or less, more preferably 0 pinholes/m² or more and 21 pinholes/m² or less, more preferably 0 pinholes/m² or more and 18 pinholes/m² or less, more preferably 0 pinholes/m² or more and 15 pinholes/m² or less, more preferably 0 pinholes/m² or more and 5 pinholes/m² or less, more preferably 0 pinholes/m² or more and 3 pinholes/m² or less, more preferably 0 pinholes/m² or more and 2 pinholes/m² or less, and more preferably 0 pinholes/m² or more and 1 pinhole/m² or less.

In yet another aspect of the ultrathin copper layer according to the present invention, the thickness of the ultrathin copper layer is 0.45 μm or less and the number of pinholes in the ultrathin copper layer is controlled to be 0 pinholes/m² or more and 30 pinholes/m² or less, is preferably 0 pinholes/m² or more and 27 pinholes/m² or less, more preferably 0 pinholes/m² or more and 24 pinholes/m² or less, more preferably 0 pinholes/m² or more and 21 pinholes/m² or less, more preferably 0 pinholes/m² or more and 18 pinholes/m² or less, more preferably 0 pinholes/m² or more and 5 pinholes/m² or less, more preferably 0 pinholes/m² or more and 3 pinholes/m² or less, more preferably 0 pinholes/m² or more and 2 pinholes/m² or less, and more preferably 0 pinholes/m² or more and 1 pinhole/m² or less.

In yet another aspect of the ultrathin copper layer according to the present invention, the thickness of the ultrathin copper layer is 0.40 μm or less and the number of pinholes in the ultrathin copper layer is controlled to be 0 pinholes/m² or more and 30 pinholes/m² or less, is preferably 0 pinholes/m² or more and 27 pinholes/m² or less, more preferably 0 pinholes/m² or more and 24 pinholes/m² or less, more preferably 0 pinholes/m² or more and 21 pinholes/m² or less, more preferably 0 pinholes/m² or more and 18 pinholes/m² or less, more preferably 0 pinholes/m² or more and 5 pinholes/m² or less, more preferably 0 pinholes/m² or more and 3 pinholes/m² or less, more preferably 0 pinholes/m² or more and 2 pinholes/m² or less, and more preferably 0 pinholes/m² or more and 1 pinhole/m² or less.

Roughening Treatment and other Surface Treatment

A roughened layer may be provided on at least one surface or both surfaces of the ultrathin copper layer and the carrier by performing a roughening treatment. Providing a roughened layer has an advantage that when laminating a copper foil provided with a carrier on a resin substrate, the adhesion strength between the resin substrate and the ultrathin copper layer or the carrier is improved, which makes the resin substrate and the ultrathin copper layer or the carrier less likely to peel apart. The roughened layer may be provided using a known method. The roughening treatment can be carried out by forming roughened particles with copper or a copper alloy, for example. Preferably, fine particles constitute the roughened layer from the perspective of formation of a fine pitch. As for the electroplating conditions in forming roughened particles, a high current density, a low copper concentration in the plating solution, or a large quantity of coulomb tends to make the particles fine. The roughened layer may be a layer consisting of a simple substance selected from the group consisting of copper, nickel, cobalt, phosphorous, tungsten, arsenic, molybdenum, chromium and zinc, an alloy containing one or more thereof, or the like. Alternatively, after forming roughened particles with copper or a copper alloy, a roughening treatment can be carried out in which secondary particles or tertiary particles are further provided using a simple substance of nickel, cobalt, copper or zinc or an alloy thereof. Thereafter, a heat resistant layer or an anti-corrosion layer may be formed with a simple substance of nickel, cobalt, copper or zinc, or an alloy thereof, and further on the surface a chromate-treated layer or a silane coupling-treated layer may be provided using a treatment such as a chromate treatment and a silane coupling treatment. The above-described heat resistant layer, anti-corrosion layer, chromate-treated layer and silane coupling-treated layer may be each formed in a plurality of layers (e.g., two or more layers, three or more layers or the like).

Here, a chromate-treated layer refers to a layer treated with a solution containing chromic anhydride, chromic acid, dichromic acid, a chromate or a dichromate. The chromate-treated layer may contain an element such as cobalt, iron, nickel, molybdenum, zinc, tantalum, copper, aluminum, phosphorus, tungsten, tin, arsenic and titanium (any form is available such as a metal, an alloy, an oxide, a nitride and a sulfide). Specific examples of the chromate-treated layer include a chromate-treated layer which has been treated with chromic anhydride or an aqueous solution of potassium dichromate and a chromate-treated layer which has been treated with a treatment solution containing chromic anhydride or potassium dichromate and zinc.

Further, providing a roughened layer on the surface of the carrier opposite to a surface to be provided with the ultrathin copper layer has an advantage that when laminating the carrier on a support such as a resin substrate from the surface having the roughened layer, the carrier and the resin substrate become less likely to peel apart. Further forming a surface-treated layer such as a heat resistant layer above the roughened layer on the surface of the ultrathin copper layer or the carrier as described above can well suppress the diffusion of elements such as copper from the ultrathin copper layer or the carrier to a resin base material to be laminated, and the close adhesion properties due to heating and pressure-bonding in lamination with a resin base material are improved.

As the heat resistant layer or the anti-corrosion layer, a known heat resistant layer or anti-corrosion layer can be used. For example, the heat resistant layer and/or the anti-corrosion layer may be a layer containing one or more elements selected from the group consisting of nickel, zinc, tin, cobalt, molybdenum, copper, tungsten, phosphorus, arsenic, chromium, vanadium, titanium, aluminum, gold, silver, a platinum group element, iron and tantalum, or may be a metal layer or an alloy layer consisting of one or more elements selected from the group consisting of nickel, zinc, tin, cobalt, molybdenum, copper, tungsten, phosphorus, arsenic, chromium, vanadium, titanium, aluminum, gold, silver, a platinum group element, iron and tantalum. Alternatively, the heat resistant layer and/or the anti-corrosion layer may contain an oxide, a nitride or a silicide containing the above-described element. Further, the heat resistant layer and/or the anti-corrosion layer may be a layer containing a nickel-zinc alloy. Furthermore, the heat resistant layer and/or the anti-corrosion layer may be a nickel-zinc alloy layer. The nickel-zinc alloy layer may be a layer containing 50 wt % to 99 wt % of nickel and 50 wt % to 1 wt % of zinc, excluding an inevitable impurity. The total amount of zinc and nickel deposited in the nickel-zinc alloy layer may be 5 to 1000 mg/m$^2$, preferably 10 to 500 mg/m$^2$, and preferably 20 to 100 mg/m$^2$. Further, the ratio of the amount of nickel deposited to the amount of zinc deposited (=amount of nickel deposited/amount of zinc deposited) in the layer containing a nickel-zinc alloy or the nickel-zinc alloy layer is preferably 1.5 to 10. Furthermore, the amount of nickel deposited in the layer containing a nickel-zinc alloy or the nickel-zinc alloy layer is preferably 0.5 mg/m$^2$ to 500 mg/m$^2$, and more preferably 1 mg/m$^2$ to 50 mg/m$^2$. In the case that the heat resistant layer and/or the anti-corrosion layer is a layer containing a nickel-zinc alloy, when the inner wall portion of a through-hole, a via hole or the like contacts with a desmear solution, the interface between the copper foil and the resin substrate is less likely to be eroded by the desmear solution and the close adhesion properties between the copper foil and the resin substrate are improved.

For example, the heat resistant layer and/or the anti-corrosion layer may be a layer in which a nickel layer or a nickel alloy layer with the amount deposited of 1 mg/m$^2$ to 100 mg/m$^2$, preferably 5 mg/m$^2$ to 50 mg/m$^2$, and a tin layer with the amount deposited of 1 mg/m$^2$ to 80 mg/m$^2$, preferably 5 mg/m$^2$ to 40 mg/m$^2$ are laminated sequentially, and the nickel alloy layer may be composed of any one of a nickel-molybdenum alloy, a nickel-zinc alloy, a nickel-molybdenum-cobalt alloy and a nickel-tin alloy.

The silane coupling-treated layer may be formed using a known silane coupling agent, and may be formed using a silane coupling agent such as an epoxy silane, an amino silane, a methacryloxy silane, a mercapto silane, a vinyl silane, an imidazole silane and a triazine silane. Two or more of these silane coupling agents may be used in a mixture. Among them, the silane coupling-treated layer is preferably formed using an amino silane coupling agent or an epoxy silane coupling agent.

It is desirable to provide the silane coupling layer in a range of, in terms of silicon atoms, 0.05 mg/m$^2$ to 200 mg/m$^2$, preferably 0.15 mg/m$^2$ to 20 mg/m$^2$, and preferably 0.3 mg/m$^2$ to 2.0 mg/m$^2$. If in this range, the close adhesion properties between the base material resin and the surface-treated copper foil can be further improved.

In addition, the surface of the ultrathin copper layer, the roughened layer, the heat resistant layer, the anti-corrosion layer, the silane coupling-treated layer or the chromate-treated layer can be subjected to a surface treatment described in International Publication No. WO2008/053878, Japanese Patent Laid-Open No. 2008-111169, Japanese Patent No. 5024930, International Publication No. WO2006/028207, Japanese Patent No. 4828427, International Publication No. WO2006/134868, Japanese Patent No. 5046927, International Publication No. WO2007/105635 or Japanese Patent No. 5180815, Japanese Patent Laid-Open No. 2013-19056.

Method for Fabricating Copper Foil Provided with Carrier

The method for fabricating the copper foil provided with a carrier according to the present invention will now be described. In order to fabricate the copper foil provided with a carrier according to the present invention, all of the following four fabrication conditions need to be satisfied.

(1) While conveying the carrier supported by a drum in a roll-to-roll conveying system, the intermediate layer (also referred to as peel layer) and the ultrathin copper layer are formed using electrolytic plating.

(2) The surface roughness Rt of the carrier on the side to be provided with the ultrathin copper layer measured using a non-contact roughness meter in accordance with JIS B0601-2001 is 1.5 μm or less.

(3) A drying step does not exist in the course of conveying between electrolytic platings.

(4) The electrolyte for forming the ultrathin copper layer contains a gloss agent.

Regarding (1):

FIG. 1 is a schematic view illustrating a foil-conveying system according to the method for fabricating a copper foil provided with a carrier according to an embodiment of the present invention. In the method for fabricating a copper foil provided with a carrier according to the embodiment of the present invention, the surface of a long carrier conveyed in the length direction by a roll-to-roll conveying system is treated to fabricate a copper foil provided with a carrier which includes a carrier, an intermediate layer laminated above the carrier and an ultrathin copper layer laminated above the intermediate layer. The method for fabricating a copper foil provided with a carrier according to the embodiment of the present invention includes: a step of forming an ultrathin copper layer on the surface of a carrier using electrolytic plating while supporting the carrier conveyed by conveying rolls with a drum; a step of forming an ultrathin copper layer on the surface of an intermediate layer using electrolytic plating while supporting the carrier on which the intermediate layer has been formed with a drum; and a step of forming a roughened particle layer on the surface of the ultrathin copper layer using electrolytic plating while supporting the carrier. In each step, the treated surface of the carrier supported by a drum serves as a cathode simultaneously, and each electrolytic plating is carried out in a plating solution present between this drum and an anode provided opposite to the drum. In this way, by forming the intermediate layer and the ultrathin copper layer using electrolytic plating while conveying the carrier supported by a drum in a roll-to-roll conveying system, the anode-cathode interelectrode distance is stabilized. As a result, variation of the thickness of layers to be formed is well suppressed, which enables to produce such a super-ultrathin copper layer as the present invention precisely. Further, in the case that the anode-cathode interelectrode distance is stabilized during electrolytic plating and as a result variation of the thickness of the intermediate layer to be formed on the surface of the carrier is well suppressed, the diffusion of Cu from the carrier to the ultrathin copper layer is also suppressed evenly. Thereby, the generation of pinholes in the ultrathin copper layer is well suppressed.

As an alternative method other than supporting with a drum, there exist strategies in which the distance between conveying rolls is reduced in apparatus for fabrication in forming the ultrathin copper layer and further the ultrathin copper layer is formed with a conveying tension about 3 to 5 times larger than that in a common case. This is because when a support roll or the like is introduced to reduce the distance between conveying rolls (e.g., about 800 to 1,000 mm) and further the conveying tension is set to 3 to 5 times larger than that in a common case, the position of the carrier is stabilized and the anode-cathode interelectrode distance is stabilized. Due to the interelectrode distance being stabilized, it is possible to make the distance between the anode and the cathode smaller than that in a common case.

On the other hand, the formation using not a drum system but sputtering or electroless plating has a problem of a high fabrication cost because of high running costs to maintain the apparatus and high costs of a sputtering target and chemical solutions such as a plating solution.

Regarding (2):

Further, the surface on the ultrathin copper layer side of the carrier has an Rt of 1.5 μm or less measured using a non-contact roughness meter in accordance with JIS B0601-2001. This also stabilizes the anode-cathode interelectrode distance in the electrolytic plating for forming an intermediate layer and an ultrathin copper layer on the surface of the carrier. The above Rt of the surface on the ultrathin copper layer side of the carrier is more preferably 1.2 μm or less, and even more preferably 1.0 μm or less. However, because too small Rt lowers the adhesion force to a resin, the Rt is preferably 0.01 μm or more, and more preferably 0.1 μm.

Regarding (3):

In the method for fabricating a copper foil provided with a carrier according to the present invention, a drying step does not exist in the course of conveying between the above-described electrolytic platings. In general, an intermediate layer is contacted with an air to dry, for example, after carrying the intermediate layer out of an electroplating bath for forming an intermediate layer and before carrying the intermediate layer into an electroplating bath for a next step of forming an ultrathin copper layer. On the other hand, in the present invention, drying out is prevented by showering the carrier intermediate layer and the ultrathin copper layer with water, a plating solution or the like in the course of conveying between the electroplating steps, making the pressure of a liquid-draining roll weaker than that in a common case, increasing the line speed, or the like. Inhibiting drying out in this way prevents the formation of an oxide film on the surface of the intermediate layer or the ultrathin copper layer, and enables to obtain an effect of reducing the number of pinholes in the ultrathin copper layer due to the oxide film.

Regarding (4):

In the method for fabricating a copper foil provided with a carrier according to the present invention, the electrolyte for forming the ultrathin copper layer contains a gloss agent. This configuration enables to suppress the generation of a locally thin part in the ultrathin copper layer, which as a result makes it possible to produce the super-ultrathin copper layer according to the present invention. Here, a gloss agent refers to a substance, a compound or an element or an ion that makes a plating surface gloss and/or smooth. Further, the ultrathin copper layer is preferably formed from a gloss copper plating. A gloss copper plating refers to one in which the gloss at 60° of the surface is 75% or more in the TD (the width direction of a carrier) (in the case that the surface of an ultrathin copper layer is subjected to a surface treatment such as a roughening treatment, the gloss of the surface of the ultrathin copper layer can also be determined by measuring the gloss of the surface on the carrier side of the ultrathin copper layer after peeling the ultrathin copper layer from the copper foil provided with a carrier). A known gloss copper plating can be used. For example, the following gloss copper plating can be used: (a) gloss copper sulfate plating, (b) gloss copper pyrophosphate plating, (c) gloss copper cyanide plating or (d) gloss copper sulfamate plating.

(a) Gloss Copper Sulfate Plating

A copper sulfate plating refers to a plating formed using a plating bath containing sulfuric acid and a copper ion. For example, a gloss copper sulfate plating can be formed using the following gloss copper sulfate plating bath.

As the gloss agent, the following (i), (ii) and (iii) or (iv) are preferably contained, and more preferably the following four kinds, (i) to (iv), are contained.

(i) Halide ion (an Orientation-controlling Agent having a Function to be Adsorbed on the Surface of Copper), Cl$^-$, Br$^-$, I$^-$ or the like (ii) Sulfur-containing Organic Compound (a Brightener)

A deposition accelerator for copper, SPS (bis(3-sulfopropyl)disulfide), DMTD (di-mercaptothiadiazole), thiourea, a compound having one or more mercapto groups, a thiol or a sulfide (a compound having the structure (R—(S)$_n$—R') such as a sulfide, a disulfide and a trisulfide, wherein n is an integer of 1 to 10; R and R' are a group containing one or more elements selected from the group consisting of carbon, hydrogen, sulfur, nitrogen and oxygen; and R and R' may have the same structure).

Alternatively, the following sulfur-containing organic compounds described in Japanese Patent Laid-Open No. 2004-107786 may be used.

A sulfur-containing compound represented by the following formula (X1) or (X2)

$$X—R^1—(S)_n—R^2—YO_3Z^1 \quad (X1)$$

$$R^4—S—R^3—SO_3Z^2 \quad (X2)$$

wherein R$^1$, R$^2$ and R$^3$ are each an alkylene group having 1 to 8 carbon atoms; R$^4$ is selected from the group consisting of hydrogen and the following general formulae (X3 to X6); X is selected from the group consisting of hydrogen, a sulfonic acid group, a phosphoric acid group, and an alkali metal salt group or an ammonium salt group of sulfonic acid or phosphonic acid; Y is any one of sulfur and phosphorous; Z$^1$ and Z$^2$ are each any one of hydrogen, sodium and potassium; and n is 2 or 3.

(X3)

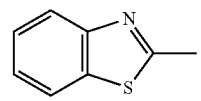

(X4)

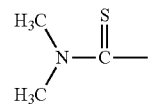

(X5)

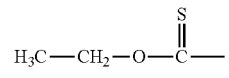

(X6)

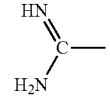

As the above sulfur-containing organic compound, the following compounds may be used.

One or two or more sulfur-containing organic compounds selected from an organic sulfonic acid and a salt thereof, a polysulfurized compound represented by the general formula R'—(S)n-R—SO$_3$M (with the proviso that M is an alkali metal or an ammonium ion; each R is independently a divalent aliphatic or aromatic nonheterocyclic group having 1 to 10 carbon atoms; R' is hydrogen, a metal cation or a monovalent aliphatic or aromatic organic group having 1 to 20 carbon atoms, or the group —R—SO$_3$M or R—(S)q-RSO$_3$M; and n and q are each an integer of 2 to 5), a sulfoformalalkyl sulfide containing the group —S—CH$_2$O—R—SO$_3$M (with the proviso that M is an alkali cation; and R is an alkyl group containing 3 to 8 carbon atoms).

Alternatively, the following compounds may be used as the above sulfur-containing organic compound.

One or two or more sulfur-containing or nitrogen-containing organic compounds selected from thiourea and a derivative thereof, a thiocarbazonic acid derivative, dehydrothio p-toluidine and a derivative thereof, a heterocyclic compound represented by the general formula (A) and a tautomer thereof (with the proviso that X is any one atom of S, O and N; and Y is an organic group having 1 to 20 carbon atoms), a polysulfurized alkylene compound represented by the general formula (B) or (C) (with the proviso that R$_1$ and R$_2$ are each an alkyl group or hydrogen; and R$_3$ is an aromatic, heterocyclic or aliphatic group or an alkyl derivative thereof).

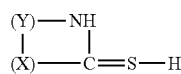

(A)

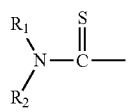

(B)

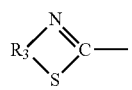

(C)

(iii) Nitrogen-containing Organic Compound (a Leveler)

A nitrogen-containing compound suppresses the deposition of copper in a convex portion as a deposition inhibitor for copper and promotes the deposition of copper in a concave portion. An amine compound or the like or a dye such as Janus Green B may be used, and for example, the following nitrogen-containing organic compounds described in Japanese Patent Laid-Open No. 2004-107786 and Japanese Patent Laid-Open No. 2004-137588 may be used.

An amine compound having a specific backbone represented by the following general formula (D) (wherein R$_1$ and R$_2$ are selected from the group consisting of a hydroxyalkyl group, an ether group, an aromatic group, an aromatic-substituted alkyl group, an unsaturated hydrocarbon group and an alkyl group; A denotes an epoxy compound residue; and n denotes an integer of 1 or more).

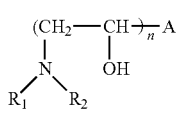

(D)

The epoxy compound residue A in the amine compound having a specific backbone may have a linear ether linkage.

The amine compound having a specific backbone may contain any one of the following general formulae (E) to (L) (wherein R$_1$ and R$_2$ are selected from the group consisting of a hydroxyalkyl group, an ether group, an aromatic group, an aromatic-substituted alkyl group, an unsaturated hydrocarbon group and an alkyl group).

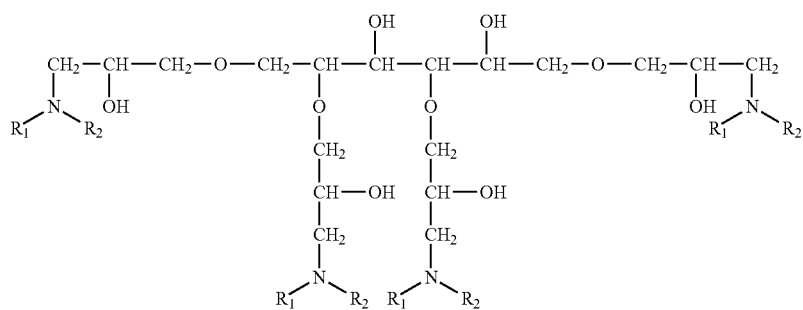

(E)

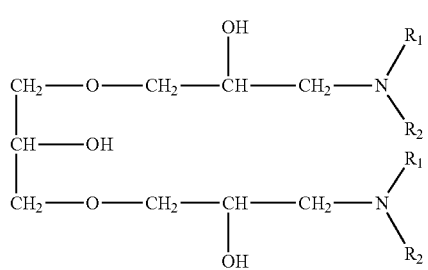

(F)

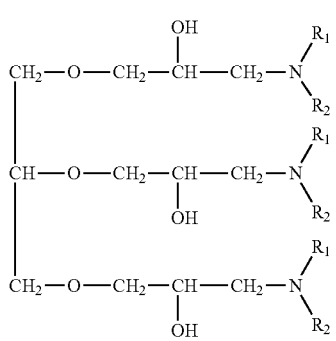

(G)

-continued

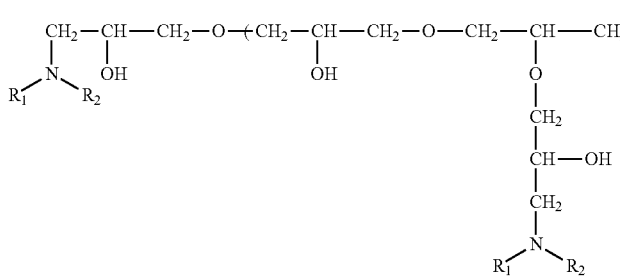

(H)

(n: an interger of 1 to 5)

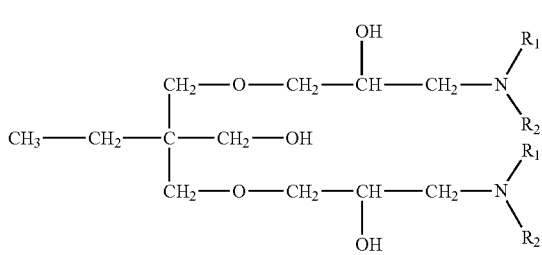

(I)

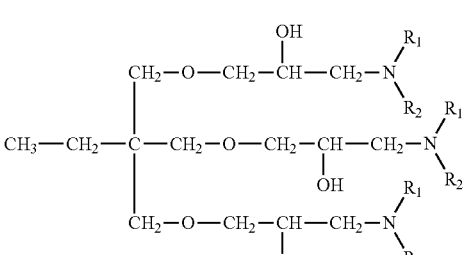

(J)

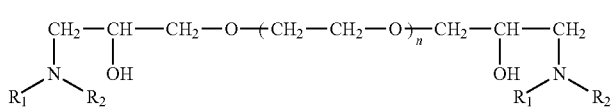

(K)

(n: an interger of 1 to 22)

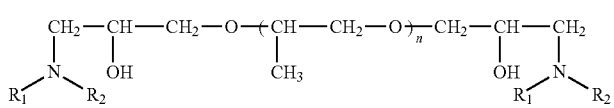

(L)

(n: an interger of 1 to 3)

A quaternary amine compound having a specific backbone represented by the following general formula (M) may be used (wherein $R_1$ and $R_2$ are selected from the group consisting of a hydroxyalkyl group, an ether group, an aromatic group, an aromatic-substituted alkyl group, an unsaturated hydrocarbon group and an alkyl group; $R_3$ denotes a benzyl group, an allyl group or an alkyl group; A denotes an epoxy compound residue; $X_1^-$ denotes $Cl^-$, $Br^-$ or $CH_3SO_4^-$; and n denotes an integer of 1 or more).

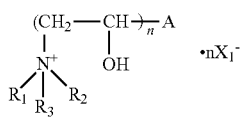

(M)

The epoxy compound residue A in the quaternary amine compound having a specific backbone may have a linear ether linkage.

The quaternary amine compound having a specific backbone may be any one of the following general formulae (N) to (U) (wherein $R_1$ and $R_2$ are selected from the group consisting of a hydroxyalkyl group, an ether group, an aromatic group, an aromatic-substituted alkyl group, an unsaturated hydrocarbon group and an alkyl group; $R_3$ denotes a benzyl group, an allyl group or an alkyl group having 1 to 5 carbon atoms; and $X_1^-$ denotes $Cl^-$, $Br^-$ or $CH_3SO_4^-$).

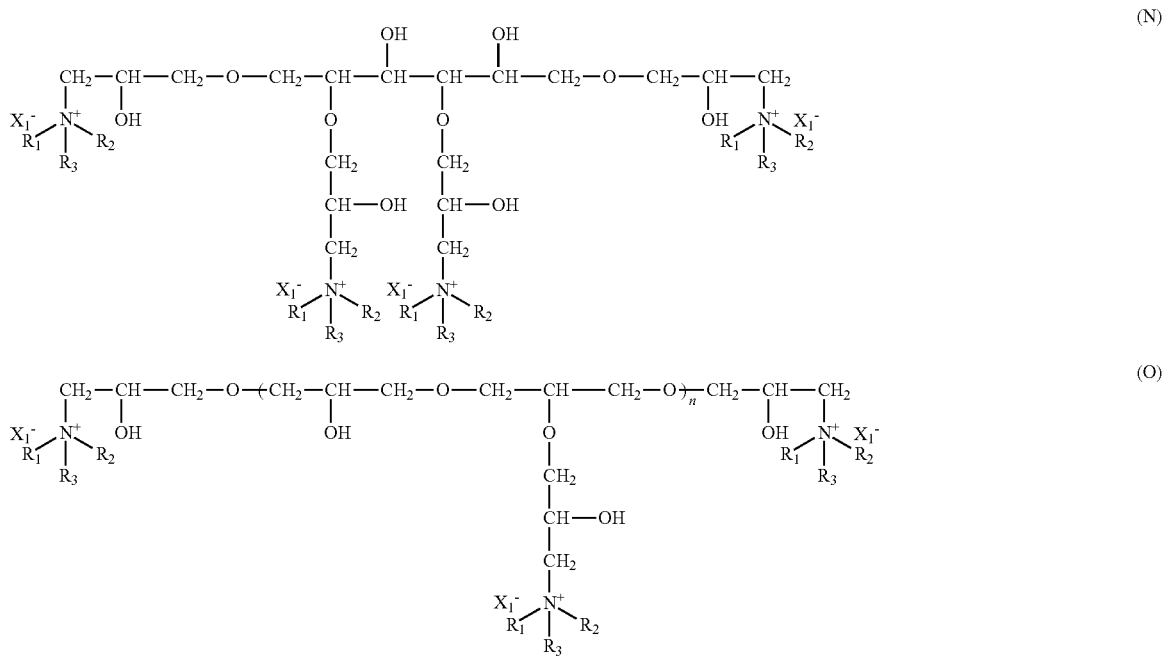
(n: an interger of 1 to 5)
(n: 1~5 の整数)
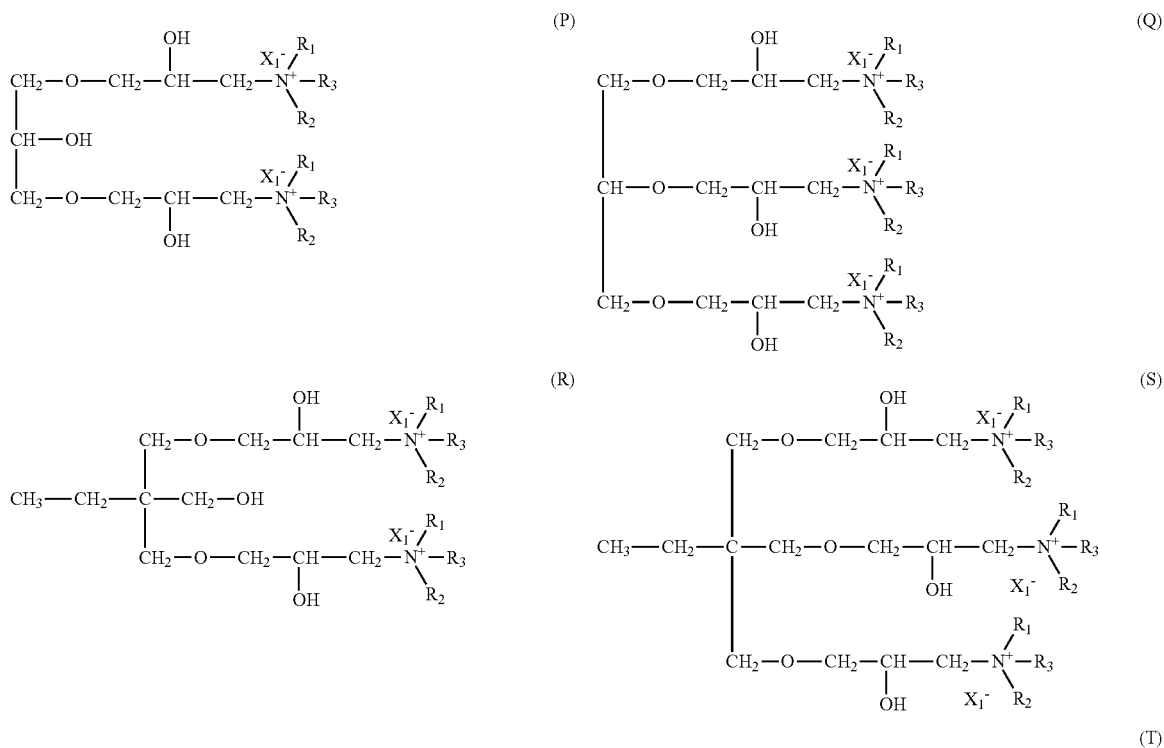
(n: an integer of 1 to 22)

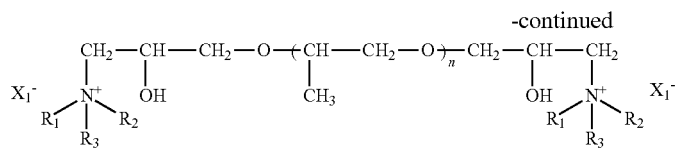

(n: an integer of 1 to 3)

Alternatively, the following compounds may be used as the above nitrogen-containing organic compound.

One or two or more nitrogen-containing organic compounds selected from an allylamine, an aralkylamine, an alkarylamine, a cyclic aliphatic amine, an acid amide represented by the general formula R—CO—NH$_2$ (with the proviso that R is a hydrocarbon group of an aliphatic or aromatic monomer or polymer), an alkylated polyalkyleneimine (a reaction product of a polyalkyleneimine with epihalohydrin or an alkylating agent), an azo dye, a phthalocyanine dye and a polymeric phenazonium compound.

(iv) High-molecular-weight Compound (a Suppressor, a Carrier, an Inhibitor) (a Compound which Preferably has a Molecular Weight of 100 to 10,000 and Suppress the Deposition Reaction of Copper under the Coexistence of a halide ion in a Wide Range of Current Density)

Examples thereof include the following nonionic surfactant, polyethylene glycol, glue and gelatin.

Nonionic Surfactant

Ester type nonionic surfactant glycerin fatty acid ester (RCOOCH$_2$CH(OH)CH$_2$OH)

sorbitan fatty acid ester, sucrose fatty acid ester ether type nonionic surfactant Fatty alcohol ethoxylate (RO(CH$_2$CH$_2$O)nH) [also referred to as alkyl polyethylene glycol] polyoxyethylene alkyl phenyl ether (RC$_6$H$_4$O(CH$_2$CH$_2$O)nH)

Triton X 100 (octoxynol), nonoxynol-9 (one of nonylphenol ethoxylates)

Alkyl glycoside (RC$_6$H$_{11}$O$_6$)

Here, the above R is a group containing one or more elements selected from the group consisting of carbon, hydrogen, sulfur, nitrogen and oxygen; hydrogen; or a halogen element. For example, R is a hydrocarbon group, an alkyl group or the like.

Alternatively, the high-molecular-weight compound may be one or two or more polyether compounds selected from a polyethylene glycol, a polypropylene glycol, a polyoxyethylene oleyl ether, a polyoxyethylene lauryl ether and a polyoxyethylene nonyl phenyl ether which have an average molecular weight of 300 to 1,000,000.

Plating Bath

Copper concentration: 80 to 120 g/L

Sulfuric acid concentration: 80 to 120 g/L

Chloride ion concentration: 20 to 100 ppm

Sulfur-containing organic compound: bis(3-sulfopropyl)disulfide: 10 to 30 ppm

Nitrogen-containing organic compound: Amine compound 1: 10 to 30 ppm

The following amine compound may be used for the Amine compound 1.

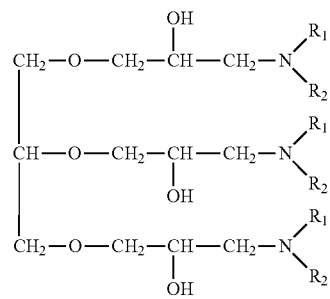

wherein $R_1$ and $R_2$ are selected from the group consisting of a hydroxyalkyl group, an ether group, an aryl group, an aromatic-substituted alkyl group, an unsaturated hydrocarbon group, and an alkyl group.

Electrolyte temperature: 50 to 80° C.

Current density: 100 A/dm$^2$

An additive used for copper damascene plating or via-fill plating may be used as the gloss agent.

(b) Gloss Copper Pyrophosphate Plating

A copper pyrophosphate plating refers to a plating formed using a plating bath containing pyrophosphoric acid and a copper ion.

In addition, the plating bath for gloss copper pyrophosphate plating needs to contain an aqueous ammonia and a sulfur-containing organic compound (a deposition accelerator for copper, a brightener).

Here, the ammonia has a function to enhance the gloss of the plating.

As the sulfur-containing organic compound, the sulfur-containing organic compound described above in the explanation of gloss copper sulfate plating can be used.

The following plating bath can be used as the plating bath for gloss copper pyrophosphate plating.

Copper pyrophosphate Cu$_2$P$_2$O$_7$·3H$_2$O: 80 to 115 g/L

Potassium pyrophosphate K$_2$P$_2$O$_7$: 250 to 400 g/L wherein the mass ratio of P$_2$O$_7$/Cu in the plating bath is preferably 6.5 to 8.5.

Copper: 15 to 55 g/L

Aqueous ammonia: 1 to 3 mL/L (ammonia concentration: 20 to 30% by mass)

Sulfur-containing organic compound (DMTD (2,5-dimercapto-1,2,4-thiadiazole) or the like): a proper amount (1 to 3,000 ppm by mass)

Current density: 0.1 to 4.5 A/dm$^2$

Temperature: 40 to 70° C.

pH: 8.0 to 9.0

(c) Gloss Copper Cyanide Plating

The following plating bath can be used as the plating bath for gloss copper cyanide plating.

Copper cyanide (CuCN): 20 to 120 g/L

Sodium cyanide (NaCN): 30 to 135 g/L

Sodium hydroxide (NaOH): 0 to 40 g/L (this is unnecessary in the case that the concentration of copper cyanide is as low as 20 to 30 g/L)

Free sodium cyanide: 5 to 15 g/L

Current density: 0.1 to 3 A/dm² (this is set to be low in the case that the concentration of copper cyanide is low, and set to be high in the case that the concentration of copper cyanide is high.)

Temperature: 30 to 85° C. (this is set to be low in the case that the concentration of copper cyanide is low, and set to be high in the case that the concentration of copper cyanide is high.)

Additive to provide a plating layer with gloss

Further, the plating bath for gloss copper cyanide plating needs to contain one or more additives selected from the group consisting of the following (1), (2) and (3):

(1) Sodium selenite, selenous acid, lead acetate
(2) A sulfur-containing compound as a glossing agent (a compound which contributes to glossing by depositing copper to reduce microscopic unevenness in the surface of a metal): a thiocyanate (such as potassium thiocyanate), a xanthogenate, a thiosulfate
(3) A tartrate (such as lead tartrate) as a smoothing agent (a compound which contributes to smoothing by depositing copper to reduce comparatively larger unevenness than microscopic unevenness which a glossing agent targets), a surfactant (a known surfactant and the above nonionic surfactant described in the explanation of gloss copper sulfate plating may be also used.)

(d) Gloss Copper Sulfamate Plating

An example of the bath for copper sulfamate strike plating is shown in the following.

Copper sulfamate $Cu(NH_2SO_3)_2 \cdot 4H_2O$: 200 to 550 g/L

Sulfamic acid: 10 to 50 g/L

Gloss agent: the same gloss agent as for gloss copper sulfate plating can be used.

Current density: 1 to 15 A/dm²

Printed Wiring Board and Laminate

A laminate (e.g., a copper-clad laminate and the like) can be produced by pasting a copper foil provided with a carrier on an insulating resin sheet from the ultrathin copper layer side followed by heating and pressure-bonding, and then peeling off the carrier. Further thereafter, the ultrathin copper layer portion can be etched to form a copper circuit for a printed wiring board. The insulating resin sheet to be used here is not especially limited as long as the insulating resin sheet has properties that allow to it to be applied in a printed wiring board. Examples that can be used include, for a rigid PWB, a paper substrate phenolic resin, a paper substrate epoxy resin, a synthetic fiber fabric substrate epoxy resin, a glass cloth-paper composite substrate epoxy resin, a glass cloth-glass non-woven composite substrate epoxy resin, and a glass cloth substrate epoxy resin, and for an FPC, a polyester film and a polyimide film. The printed wiring board or the laminate produced in this way can be mounted on various electronic components for which high-density implementation of mounted components is required.

Note that, in the present invention, a "printed wiring board" includes a printed wiring board with components equipped thereon and a printed circuit board and a printed substrate. In addition, an electronic device can be fabricated using such a printed wiring board. Note that, in the present invention, a "copper circuit" includes a copper wiring.

Further, the copper foil provided with a carrier may be provided with a roughened layer above the ultrathin copper layer, and may be provided with one or more layers selected from the group consisting of a heat resistant layer, an anti-corrosion layer, a chromate-treated layer and a silane coupling-treated layer above the roughened layer.

Furthermore, the copper foil provided with a carrier may be provided with a roughened layer above the ultrathin copper layer, and may be provided with a heat resistant layer or anti-corrosion layer above the roughened layer, and may be provided with a chromate-treated layer above the heat resistant layer or anti-corrosion layer, and may be provided with a silane coupling-treated layer above the chromate-treated layer.

Alternatively, the copper foil provided with a carrier may be provided with one or more layers selected from the group consisting of a heat resistant layer, an anti-corrosion layer, a chromate-treated layer and a silane coupling-treated layer on at least one surface or both surfaces of the an ultrathin copper layer and the carrier.

Alternatively, the copper foil provided with a carrier may be provided with a resin layer above the ultrathin copper layer, or above the roughened layer, or above the heat resistant layer or anti-corrosion layer, or a chromate-treated layer, or a silane coupling-treated layer.

The above-described resin layer may be an adhesive, and may also be an insulating resin layer in a semi-cured state (B stage state) for adhesion. This semi-cured state (B stage state) includes states in which there is no stickiness feeling even if the surface is touched with a finger, the insulating resin layer can be stacked and stored, and a curing reaction occurs when further subjected to a heating treatment.

Further, the above-described resin layer may include a thermosetting resin, or may be a thermoplastic resin. In addition, the above-described resin layer may include a thermoplastic resin. This resin layer may include known resins, resin curing agents, compounds, curing accelerators, dielectrics, reaction catalysts, cross-linking agents, polymers, prepregs, skeletal materials, and the like. Still further, the resin layer may be formed using the substances (resins, resin curing agents, compounds, curing accelerators, dielectrics, reaction catalysts, cross-linking agents, polymers, prepregs, skeletal materials, and the like) and/or resin layer formation method and formation apparatus described in International Publication No. WO 2008/004399, International Publication No. WO 2008/053878, International Publication No. WO 2009/084533, Japanese Patent Laid-Open No. 1999-5828, Japanese Patent Laid-Open No. 1999-140281, Japanese Patent No. 3184485, International Publication No. WO 97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO 2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO 2006/028207, Japanese Patent No. 4828427, Japanese Patent Laid-Open No. 2009-67029, International Publication No. WO 2006/134868, Japanese Patent No. 5046927, Japanese Patent Laid-Open No. 2009-173017, International Publication No. WO 2007/105635, Japanese Patent No. 5180815, International Publication No. WO 2008/114858, International Publication No. WO 2009/008471, Japanese Patent Laid-Open No. 2011-14727, International Publication No. WO 2009/001850, International Publication No. WO 2009/145179, International Publication No. WO 2011/068157, Japanese Patent Laid-Open No. 2013-19056.

Further, the type of the above-described resin layer is not especially limited. Examples of preferred resins can include one or more selected from the group consisting of epoxy resins, polyimide resins, polyfunctional cyanate compounds, maleimide compounds, polymaleimide compounds, maleimide resins, aromatic maleimide resins, polyvinyl acetal resins, urethane resins, polyether sulfone (also called polyether sulphone), polyether sulfone (also called polyether sulphone) resins, aromatic polyamide resins, aromatic polyamide resin polymers, rubber resins, polyamines, aromatic polyamines, polyamide-imide resins, rubber-modified epoxy resins, phenoxy resins, carboxyl group-modified acrylonitrile-butadiene resins, polyphenylene oxide, bismaleimide triazine resins, thermosetting polyphenylene oxide resins, cyanate ester resins, carboxylic acid anhydrides, polybasic carboxylic acid anhydrides, linear polymers having a crosslinkable functional group, polyphenylene ether resins, 2,2-bis(4-cyanatophenyl)propane, phosphorus-containing phenol compounds, manganese naphthenate, 2,2-bis(4-glycidylphenyl)propane, polyphenylene ether-cyanate resins, siloxane-modified polyamide-imide resins, cyano ester resins, phosphazene resins, rubber-modified polyamide-imide resins, isoprene, hydrogenated polybutadiene, polyvinyl butyral, phenoxy, high-molecular-weight epoxys, aromatic polyamides, fluororesins, bisphenol, polyimide block copolymer resins, and cyano ester resins.

In addition, the above-described epoxy resin can be used without any particular problem as long as it has two or more epoxy groups in the molecule and can be used in electrical/electronic material applications. Moreover, an epoxy resin epoxied using a compound having two or more glycidyl groups in the molecule is preferred. Further examples of epoxy resins that can be used include one or a mixture of two or more selected from the group consisting of bisphenol A type epoxy resins, bisphenol F type epoxy resins, bisphenol S type epoxy resins, bisphenol AD type epoxy resins, novolak type epoxy resins, cresol novolak type epoxy resins, alicyclic epoxy resins, brominated epoxy resins, phenol novolak type epoxy resins, naphthalene type epoxy resins, brominated bisphenol A type epoxy resins, ortho-cresol novolak type epoxy resins, rubber-modified bisphenol A type epoxy resins, glycidyl amine compounds such as glycidyl amine type epoxy resins, triglycidyl isocyanurate, and N,N-diglycidyl aniline, glycidyl ester compounds such as diglycidyl tetrahydrophthalate, phosphorus-containing epoxy resins, biphenyl type epoxy resins, biphenyl novolak type epoxy resins, tris(hydroxyphenyl)methane type epoxy resins, and tetraphenylethane type epoxy resins. Also, a hydrogenated product or a halide of the above-described epoxy resins may be used.

A known phosphorus-containing epoxy resin can be used for the above-described phosphorus-containing epoxy resin. Further, it is preferred that the above-described phosphorus-containing epoxy resin is an epoxy resin obtained as a derivative from, for example, 9,10-dihydro-9-oxa-10-phosphaphenanthrene-10-oxide that includes two or more epoxy groups in the molecule.

(In the Case that the Resin Layer Includes a Dielectric (Dielectric Filler))

The resin layer may include a dielectric (dielectric filler).

In the case that a dielectric (dielectric filler) is included in any of the above resin layers or resin compositions, the dielectric is used for an application of forming a capacitor layer and thereby enables to increase the capacitance of a capacitor circuit. As this dielectric (dielectric filler), a dielectric powder of a complex oxide having a perovskite structure such as $BaTiO_3$, $SrTiO_3$, $Pb(Zr—Ti)O_3$ (commonly called PZT), $PbLaTiO_3.PbLaZrO$ (commonly called PLZT), and $SrBi_2Ta_2O_9$ (commonly called SBT).

The resin and/or resin composition and/or compound included in the above-described resin layer is obtained in a B stage state by, for example, dissolving in a solvent such as methyl ethyl ketone (MEK), cyclopentanone, dimethylformamide, dimethylacetamide, N-methylpyrrolidone, toluene, methanol, ethanol, propylene glycol monomethyl ether, dimethylformamide, dimethylacetamide, cyclohexanone, ethyl cellosolve, N-methyl-2-pyrrolidone, N,N-dimethylacetamide, N,N-dimethylformamide to produce a resin solution (resin varnish), coating the resin solution on the surface on the ultrathin copper layer side of the copper foil provided with a carrier by a roll coater method, for example, and then heating and drying as necessary to remove the solvent. The drying can be carried out using, for example, a hot air drying furnace, at a drying temperature of 100 to 250° C., and preferably 130 to 200° C. The composition of the above-described resin layer may be dissolved using a solvent to obtain the resin solution having a resin solid content of 3% by weight to 70% by weight, preferably 3% by weight to 60% by weight, preferably 10% by weight to 40% by weight, and more preferably 25% by weight to 40% by weight. Further, from an environmental standpoint, at the current point it is most preferred to dissolve using a mixed solvent of methyl ethyl ketone and cyclopentanone. In addition, it is preferred to use as the solvent a solvent having a boiling point in the range of 50° C. to 200° C.

Still further, it is preferred that the above-described resin layer is a semi-cured resin film having a resin flow when measured based on MIL-P-13949G in the MIL standards in the range of 5% to 35%.

In the present specification, the resin flow is a value obtained by, based on MIL-P-13949G in the MIL standards, sampling four 10-cm square specimens from a surface-treated copper foil provided with a resin having a resin thickness of 55 μm, pasting the four specimens in a stacked state (as a laminate) under conditions of a pressing temperature of 171° C., a pressing pressure of 14 kgf/cm², and a pressing time of 10 minutes, and calculating the resin flow weight at that point from the measured results based on the following equation.

$$\text{Resin flow}(\%) = \frac{\text{Resin flow weight}}{(\text{Laminate weight}) - (\text{Copper foil weight})} \times 100$$

The surface-treated copper foil (surface-treated copper foil provided with a resin) including the above-described resin layer is used in a mode for forming a predetermined wiring pattern from the surface on the opposite side to the side subjected to the roughening treatment of the surface-treated copper foil by stacking the resin layer on the base material, then heating and pressure-bonding the whole stack to thermally cure the resin layer, and if the surface-treated copper foil is an ultrathin copper layer of a copper foil provided with a carrier, then peeling the carrier to expose the ultrathin copper layer to the surface (naturally the exposed portion is the surface on the intermediate layer side of the ultrathin copper layer).

If this surface-treated copper foil provided with a resin is used, the number of sheets of prepreg material used when fabricating a multilayer printed wiring board can be reduced. Moreover, the thickness of the resin layer can be set to a thickness that ensures interlayer insulation, and a copper-clad laminate can be fabricated even without using a prepreg material at all. Further, at this point, the smoothness of the surface can be further improved by applying an insulating resin as an undercoat on the surface of the base material.

Further, not using a prepreg material has the economic advantages that the costs of the prepreg material can be saved, and the lamination step can be simplified. Moreover, there is also the advantage that the thickness of the multilayer printed wiring board to be fabricated is thinner by the thickness amount of the prepreg material, so that a very thin multilayer printed wiring board in which the thickness of one layer is 100 μm or less can be fabricated.

The thickness of this resin layer is preferably 0.1 to 500 μm, more preferably 0.1 to 300 μm, more preferably 0.1 to 200 μm, and more preferably 0.1 to 120 μm.

If the thickness of the resin layer is thinner than 0.1 μm, the adhesive strength can deteriorate, and it can become difficult to ensure interlayer insulation between an inner layer material and the circuit when this copper foil provided with a carrier provided with a resin is laminated on a base material including an inner layer material without arranging a prepreg material therebetween. On the other hand, if the resin layer thickness is thicker than 120 μm, it can be difficult to form a resin layer with a target thickness in one coating step, so that extra material costs and steps are required, which is economically disadvantageous.

Further, when the copper foil provided with a carrier having a resin layer is used to fabricate a very thin multilayer printed wiring board, it is preferred that the thickness of the above-described resin layer is 0.1 μm to 5 μm, more preferably 0.5 μm to 5 μm, and more preferably 1 μm to 5 μm, because the thickness of the multilayer printed wiring board is smaller.

Further, in the case that the thickness of the resin layer is 0.1 μm to 5 μm, it is preferred to provide a heat resistant layer and/or an anti-corrosion layer and/or a chromate-treated layer and/or a silane coupling-treated layer above the ultrathin copper layer and thereafter form a resin layer above the heat resistant layer or the anti-corrosion layer or the chromate-treated layer or the silane coupling-treated layer, to improve close adhesion properties between the resin layer and the copper foil provided with a carrier.

Here, the above-described thickness of a resin layer is the average value of thicknesses measured by cross-sectional observation at arbitrarily selected 10 points.

In addition, regarding another product form of this copper foil provided with a carrier provided with a resin, it is also possible to cover the top of the ultrathin copper layer, or the roughened layer, the heat resistant layer or the anti-corrosion layer, or the chromate-treated layer, or the silane coupling-treated layer with a resin layer, which is then semi-cured, and thereafter peel off the carrier to fabricate a copper foil provided with a resin without a carrier.

Method for Fabricating Printed Wiring Board

An embodiment of the method for fabricating a printed wiring board according to the present invention includes forming a copper-clad laminate by carrying out a step of preparing the copper foil provided with a carrier according to the present invention and an insulating substrate, a step of laminating the copper foil provided with a carrier and the insulating substrate, and a step of, after the copper foil provided with a carrier and the insulating substrate have been laminated in such a manner that the ultrathin copper layer side of the copper foil faces the insulating substrate, peeling the carrier of the copper foil provided with a carrier, and then forming a circuit by any of a semi-additive method, a modified semi-additive method, a partly additive method, and a subtractive method. The insulating substrate can also be formed between the inner layer circuits.

In the present invention, semi-additive method refers to a method for forming a pattern by performing thin electroless plating on an insulating substrate or a copper foil seed layer, and then forming a conductive pattern using electrolytic plating and etching.

Therefore, an embodiment of a method for fabricating a printed wiring board according to the present invention using a semi-additive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of removing all of an ultrathin copper layer exposed by the peeling of the carrier by a method such as plasma or etching using a corrosive solution such as an acid;

a step of providing a through-hole and/or a blind via on a resin exposed by removal of the ultrathin copper layer by etching;

a step of performing a desmearing treatment on a region including the through-hole and/or blind via;

a step of providing an electroless plating layer for a region including the resin and the through-hole and/or blind via;

a step of providing a plating resist on the electroless plating layer;

a step of exposing the plating resist and then removing the plating resist in a region where a circuit is formed;

a step of providing an electrolytic plating layer on the region where the circuit is formed from which the plating resist has been removed;

a step of removing the plating resist;

and a step of removing the electroless plating layer in regions other than where the circuit is formed by flash etching and the like.

Another embodiment of a method for fabricating a printed wiring board according to the present invention using a semi-additive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of removing all of an ultrathin copper layer exposed by the peeling of the carrier by a method such as plasma or etching using a corrosive solution such as an acid;

a step of providing an electroless plating layer for a surface of a resin exposed by removal of the ultrathin copper layer by etching;

a step of providing a plating resist on the electroless plating layer;
a step of exposing the plating resist and then removing the plating resist in a region where a circuit is formed;
a step of providing an electrolytic plating layer on the region where the circuit is formed from which the plating resist has been removed;
a step of removing the plating resist;
and a step of removing the electroless plating layer and ultrathin copper layer in regions other than where the circuit is formed by flash etching and the like.

In the present invention, modified semi-additive method refers to a method for forming a circuit on an insulating layer by laminating a metal foil on an insulating layer, protecting a non-circuit formed portion with a plating resist, performing copper thickening of a circuit formed portion by electrolytic plating, then removing the resist, and removing the metal foil at portions other than the circuit formed portion by (flash) etching.

Therefore, an embodiment of a method for fabricating a printed wiring board according to the present invention using a modified semi-additive method includes:
a step of preparing the copper foil provided with a carrier according to the present invention and an insulating substrate;
a step of laminating the copper foil provided with a carrier and the insulating substrate;
a step of, after the copper foil provided with a carrier and the insulating substrate have been laminated, peeling the carrier of the copper foil provided with a carrier;
a step of providing a through-hole and/or a blind via on an ultrathin copper layer and the insulating substrate exposed by the peeling of the carrier;
a step of performing a desmearing treatment on a region including the through-hole and/or blind via;
a step of providing an electroless plating layer for the region including the through-hole and/or blind via;
a step of providing a plating resist on an ultrathin copper layer surface exposed by the peeling of the carrier;
a step of, after providing the plating resist, forming a circuit by electrolytic plating;
a step of removing the plating resist;
and a step of removing the ultrathin copper layer exposed by the removal of the plating resist.

Another embodiment of a method for fabricating a printed wiring board according to the present invention using a modified semi-additive method includes:
a step of preparing the copper foil provided with a carrier according to the present invention and an insulating substrate;
a step of laminating the copper foil provided with a carrier and the insulating substrate;
a step of, after the copper foil provided with a carrier and the insulating substrate have been laminated, peeling the carrier of the copper foil provided with a carrier;
a step of providing a plating resist on an ultrathin copper layer exposed by the peeling of the carrier;
a step of exposing the plating resist and then removing the plating resist in a region where a circuit is formed;
a step of providing an electrolytic plating layer on the region where the circuit is formed from which the plating resist has been removed;
a step of removing the plating resist;
and a step of removing the electroless plating layer and ultrathin copper layer in regions other than where the circuit is formed by flash etching and the like.

In the present invention, partly additive method refers to a method for fabricating a printed wiring board by providing a catalyst core on a substrate that is provided with a conductive layer and in which holes for through-holes and via holes have optionally been opened, forming a conductive circuit by etching, optionally providing a solder resist or a plating resist, and then performing thickening on the conductive circuit by an electroless plating treatment on the through-holes, via holes, and the like.

Therefore, an embodiment of a method for fabricating a printed wiring board according to the present invention using a partly additive method includes:
a step of preparing the copper foil provided with a carrier according to the present invention and an insulating substrate;
a step of laminating the copper foil provided with a carrier and the insulating substrate;
a step of, after the copper foil provided with a carrier and the insulating substrate have been laminated, peeling the carrier of the copper foil provided with a carrier;
a step of providing a through-hole and/or a blind via on an ultrathin copper layer and the insulating substrate exposed by the peeling of the carrier;
a step of performing a desmearing treatment on a region including the through-hole and/or blind via;
a step of providing a catalyst core for the region including the through-hole and/or blind via;
a step of providing an etching resist on an ultrathin copper layer surface exposed by the peeling of the carrier;
a step of exposing the etching resist to form a circuit pattern;
a step of forming a circuit by removing the ultrathin copper layer and the catalyst core by a method such as plasma or etching using a corrosive solution such as an acid;
a step of removing the etching resist;
a step of providing a solder resist or a plating resist on the insulating substrate surface exposed by removing the ultrathin copper layer and the catalyst core by a method such as plasma or etching using a corrosive solution such as an acid;
and a step of providing an electroless plating layer in regions where the solder resist or the plating resist is not provided.

In the present invention, subtractive method refers to a method for forming a conductive pattern by selectively removing an unnecessary portion of copper foil on a copper-clad laminate by etching and the like.

Therefore, an embodiment of a method for fabricating a printed wiring board according to the present invention using a subtractive method includes:
a step of preparing the copper foil provided with a carrier according to the present invention and an insulating substrate;
a step of laminating the copper foil provided with a carrier and the insulating substrate;
a step of, after the copper foil provided with a carrier and the insulating substrate have been laminated, peeling the carrier of the copper foil provided with a carrier;
a step of providing a through-hole and/or a blind via on an ultrathin copper layer and the insulating substrate exposed by the peeling of the carrier;
a step of performing a desmearing treatment on a region including the through-hole and/or blind via;
a step of providing an electroless plating layer for the region including the through-hole and/or blind via;

a step of providing an electrolytic plating layer on a surface of the electroless plating layer;

a step of providing an etching resist on a surface of the electrolytic plating layer and/or the ultrathin copper layer;

a step of exposing the etching resist to form a circuit pattern;

a step of forming a circuit by removing the ultrathin copper layer, the electroless plating layer, and the electrolytic plating layer by a method such as plasma or etching using a corrosive solution such as an acid;

and a step of removing the etching resist.

Another embodiment of a method for fabricating a printed wiring board according to the present invention using a subtractive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of providing a through-hole and/or a blind via on an ultrathin copper layer and the insulating substrate exposed by the peeling of the carrier;

a step of performing a desmearing treatment on a region including the through-hole and/or blind via;

a step of providing an electroless plating layer for the region including the through-hole and/or blind via;

a step of forming a mask on a surface of the electroless plating layer;

a step of providing an electrolytic plating layer on a surface of the electroless plating layer on which the mask is not formed;

a step of providing an etching resist on a surface of the electrolytic plating layer and/or the ultrathin copper layer;

a step of exposing the etching resist to form a circuit pattern;

a step of forming a circuit by removing the ultrathin copper layer and the electroless plating layer by a method such as plasma or etching using a corrosive solution such as an acid;

and a step of removing the etching resist.

The step of providing a through-hole and/or a blind via and the subsequent desmearing step do not have to be carried out.

Here, specific examples of the method for fabricating a printed wiring board using the copper foil provided with a carrier according to the present invention will now be described with reference to the drawings. Although an example in which a roughened layer is formed is illustrated here, the fabrication method is not particularly limited thereto, and a copper foil provided with a carrier in which a surface-treated layer such as a roughened layer is not formed may be fabricated.

Figure 2A:
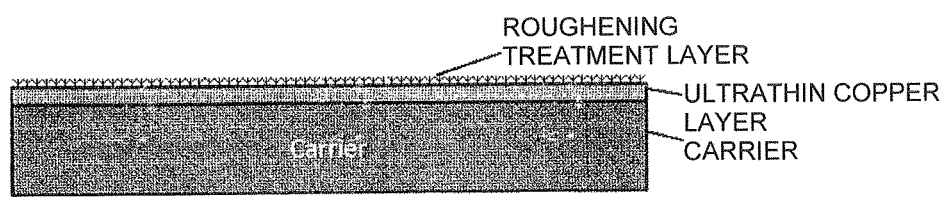
FIGS. 2A to 2C are schematic views of a circuit board cross-section during steps until circuit plating and resist removal according to a specific example of the method for fabricating a printed wiring board using the copper foil provided with a carrier according to the present invention.
Figure 2B:
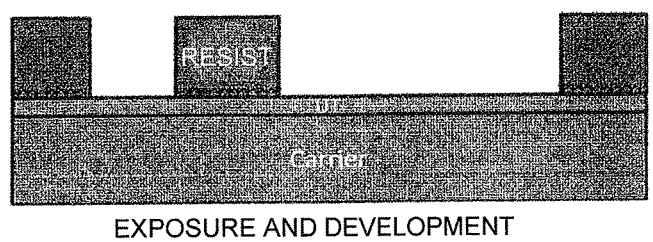
Figure 2C:
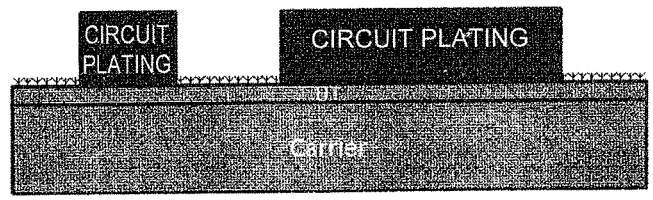

First, as illustrated in FIG. 2-A, a copper foil provided with a carrier (first layer) having an ultrathin copper layer on which a roughened layer has been formed on the surface is prepared.

Next, as illustrated in FIG. 2-B, a resist is coated on the roughened layer of the ultrathin copper layer, exposure and development is carried out, and the resist is etched into a predetermined shape.

Next, as illustrated in FIG. 2-C, a plating for a circuit is formed, and then the circuit plating is formed in a predetermined shape by removing the resist.

Figure 3D:
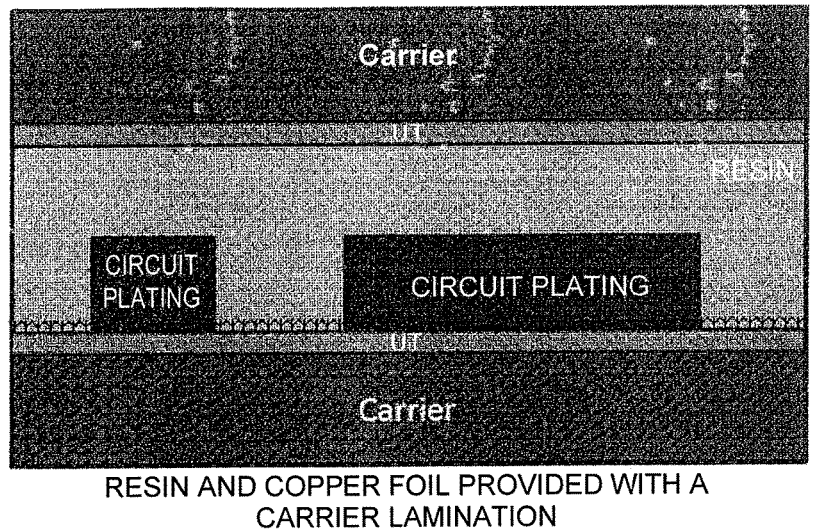
FIGS. 3D to 3F are schematic views of a circuit board cross-section during steps from lamination of a resin and a second layer of a copper foil provided with a carrier until laser hole opening according to a specific example of the method for fabricating a printed wiring board using the copper foil provided with a carrier according to the present invention.
Figure 3E:
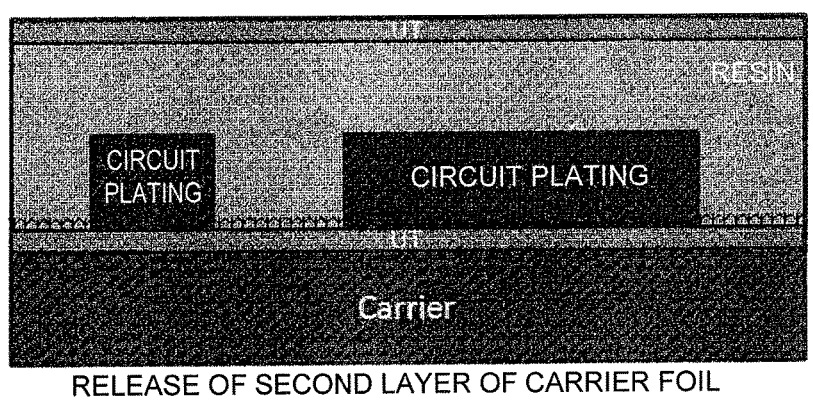
Figure 3F:
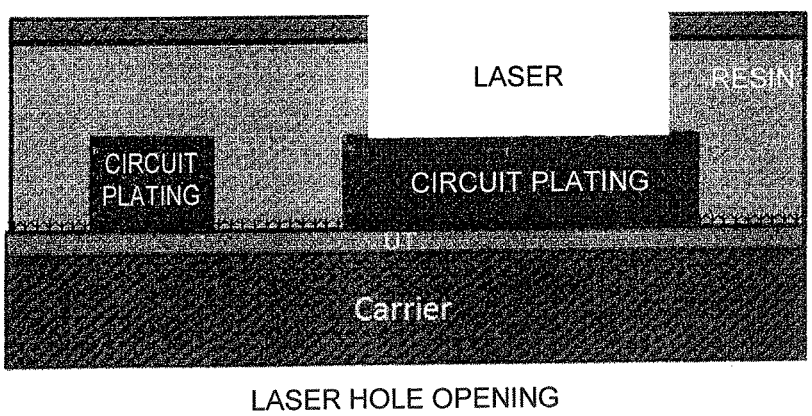

Next, as illustrated in FIG. 3-D, a resin layer is laminated by providing an embedded resin on the ultrathin copper layer so as to cover the circuit plating (so as to bury the circuit plating), and then a separate copper foil provided with a carrier (second layer) is adhered from the ultrathin copper layer side.

Next, as illustrated in FIG. 3-E, the carrier is peeled from the second layer of the copper foil provided with a carrier.

Next, as illustrated in FIG. 3-F, laser hole opening is performed on a predetermined position of the resin layer, and the circuit plating is exposed to form a blind via.

Figure 4G:
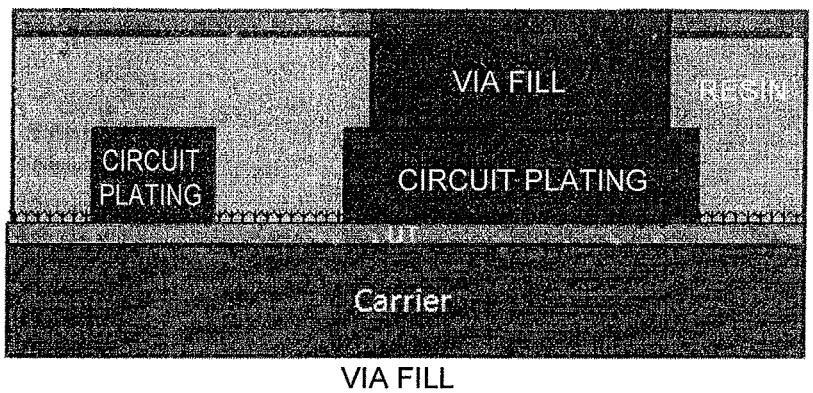
FIGS. 4G to 4I are schematic views of a circuit board cross-section during steps from via fill formation until peeling of the first carrier layer according to a specific example of the method for fabricating a printed wiring board using the copper foil provided with a carrier according to the present invention.
Figure 4H:
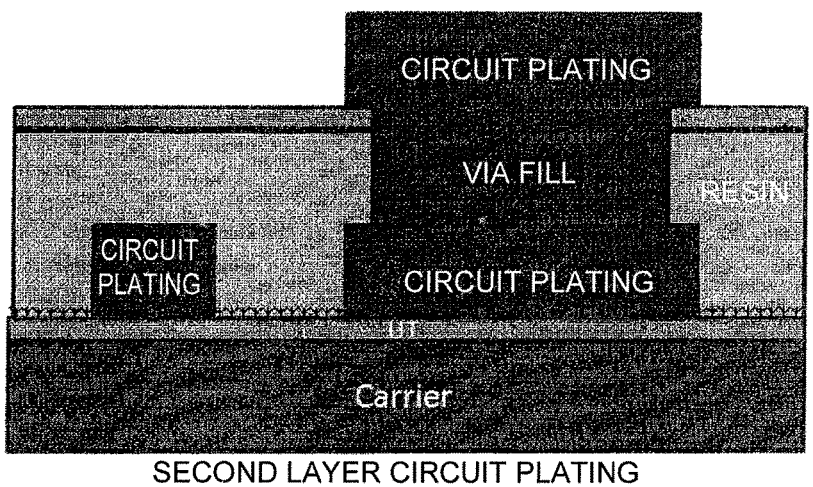
Figure 4I:
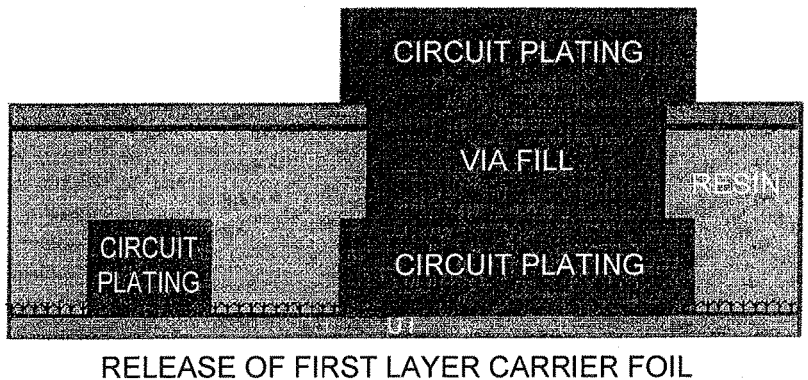

Next, as illustrated in FIG. 4-G, copper is embedded in the blind via to form a via fill.

Next, as illustrated in FIG. 4-H, a circuit plating is formed as illustrated in the above-described FIGS. 2-B and 2-C on the via fill.

Next, as illustrated in FIG. 4-I, the carrier is peeled from the first layer of the copper foil provided with a carrier.

Figure 5J:
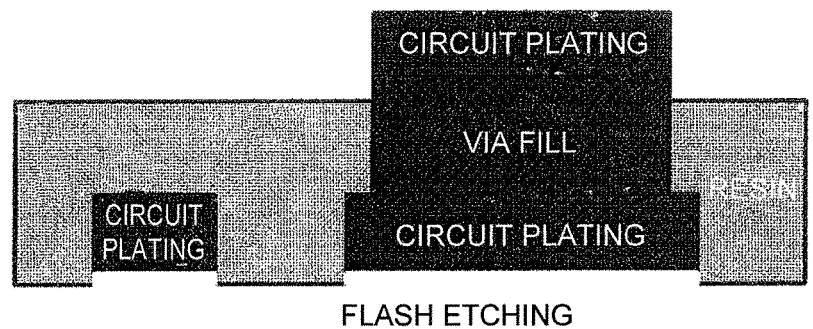
FIGS. 5J to 5K are schematic views of a circuit board cross-section during steps from flash etching until bump and copper pillar formation according to a specific example of the method for fabricating a printed wiring board using the copper foil provided with a carrier according to the present invention.
Figure 5K:
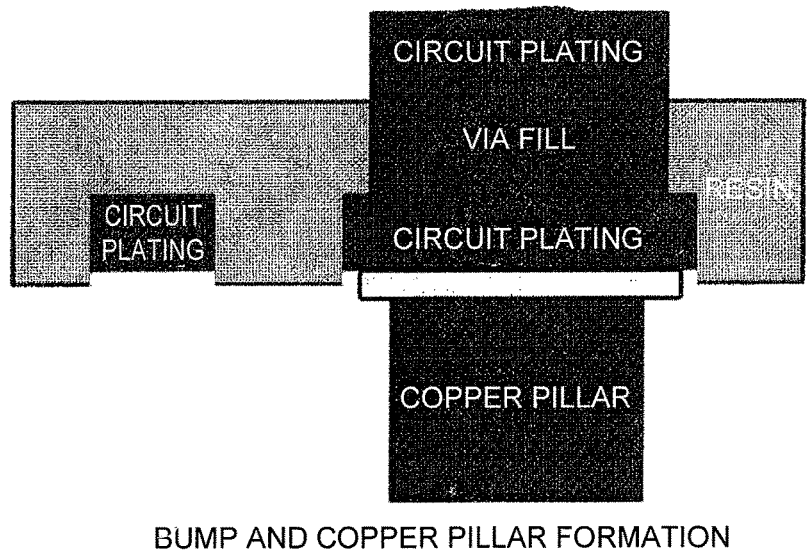

Next, as illustrated in FIG. 5-J, the ultrathin copper layer on both surfaces is removed by flash etching to expose the surface of the circuit plating in the resin layer.

Next, as illustrated in FIG. 5-K, a bump is formed on the circuit plating in the resin layer, and a copper pillar is formed on that solder. In this manner, a printed wiring board using the copper foil provided with a carrier according to the present invention is produced.

When a burying method as described above is carried out using the copper foil provided with a carrier according to the present invention, etching for exposing a buried circuit is completed in a short time due to the ultrathin copper layer being thin, which allows the productivity to be dramatically improved.

For the above-described separate copper foil provided with a carrier (second layer), the copper foil provided with a carrier according to the present invention can be used, a conventional copper foil provided with a carrier may be used, or a normal copper foil may be used. Further, a circuit may be formed in one layer or a plurality of layers on the circuit of the second layer illustrated in FIG. 4-H. These circuits can be formed by any of a semi-additive method, a subtractive method, a partly additive method, and a modified semi-additive method.

When a semi-additive method or a modified semi-additive method is carried out using the copper foil provided with a carrier according to the present invention, flush etching is completed in a short time due to the ultrathin copper layer being thin, which allows the productivity to be dramatically improved.

Further, the copper foil provided with a carrier used for the first layer may have a substrate on the carrier side surface of the copper foil provided with a carrier. By having the substrate or a resin layer, the copper foil provided with a carrier used for the first layer is supported, so that wrinkles are less likely to form. Consequently, there is the advantage that productivity is improved. Moreover, any substrate may be used for this substrate, as long as the substrate has an effect of supporting the above-described copper foil provided with a carrier used for the first layer. For example, the carrier, the prepreg, and the resin layer described in the specification of the present application, or a known carrier, prepreg, resin layer, metal sheet, metal foil, sheet of an inorganic compound, foil of an inorganic compound, sheet of an organic compound, or foil of an organic compound can be used as the above-described substrate.

Although the timing to form a substrate on the carrier side surface is not particularly limited, it is necessary to form a substrate before peeling off the carrier. In particular, it is preferred to form a substrate before a step of forming a resin layer on the ultrathin copper layer side surface of the copper foil provided with a carrier, and it is more preferred to form a substrate before a step of forming a circuit on the ultrathin copper layer side surface of the copper foil provided with a carrier.

Moreover, a known resin and prepreg can be used for the buried resin. For example, a BT (bismaleimide triazine) resin, a glass cloth prepreg impregnated with a BT resin, an ABF film or ABF manufactured by Ajinomoto Fine-Techno Co., Inc., can be used. Further, the resin layer and/or resin and/or prepreg described in the present specification can be used for the above-described buried resin.

In the copper foil provided with a carrier according to the present invention, the color difference ΔE*ab based on JIS Z8730 when the reference color is defined as the object color of a white board of the ultrathin copper layer surface (when the light source is set to D65 and the view angle is set to 10 degrees, the tristimulus values of the white board in an $X_{10}Y_{10}Z_{10}$ color system (JIS Z8701 1999) are $X_{10}$=80.7, $Y_{10}$=85.6, $Z_{10}$=91.5, and the object color of the white board in an L*a*b* color system is L*=94.14, a*=−0.90, b*=0.24), is preferably controlled to satisfy 45 or more. The above-described ΔE*ab is preferably 50 or more, more preferably 55 or more, and even more preferably 60 or more. If the color difference ΔE*ab based on JIS Z8730 of the ultrathin copper layer surface is 45 or more, for example, when forming a circuit on the ultrathin copper layer surface of the copper foil provided with a carrier, the contrast between the ultrathin copper layer and the circuit becomes very clear, so that as a result visibility is good and the positioning of the circuit can be carried out precisely. In the present invention, "color difference of the ultrathin copper layer surface" refers to the color difference of the surface of the ultrathin copper layer, or, in the case that various surface-treated layers have been provided, such as a roughened layer, a heat resistant layer, an anti-corrosion layer, a chromate-treated layer and a silane coupling-treated layer, the color difference of the surface of that surface-treated layer (outermost surface).

The above-described color difference ΔE*ab is represented by the following equation. Here, the color differences ΔL, Δa and Δb are each measured with a colorimeter. These color differences are a general index represented using an L*a*b* color system based on JIS Z8730 (2009) tinted with black/white/red/green/yellow/blue, in which ΔL is represented as white/black, Δa as red/green, and Δb as yellow/blue. The color differences (ΔL, Δa, Δb) can be measured using the colorimeter MiniScan XE Plus manufactured by HunterLab. Note that the color differences ΔL, Δa, Δb are each a color difference based on JIS Z8730 (2009) of the ultrathin copper layer surface when the reference color is defined as the object color of the above-described white board, and the color difference ΔL is the difference of CIE luminosity L* between two object colors in an L*a*b* color system defined in JIS Z8729 (2004), and Δa and Δb are the difference of a color coordinate a* or b* between two object colors in an L*a*b* color system defined in JIS Z8729 (2004), respectively.

$$\Delta E*ab=\sqrt{\Delta L^2+\Delta a^2+\Delta b^2}$$

The above-described color difference can be adjusted by increasing the current density during ultrathin copper layer formation, reducing the copper concentration in the plating solution, and increasing the linear flow rate of the plating solution.

Further, the above-described color difference can also be adjusted by providing a roughened layer by performing a roughening treatment on the surface of the ultrathin copper layer. If a roughened layer is provided, the adjustment can be carried out using an electrolyte including copper and one or more elements selected from the group consisting of nickel, cobalt, tungsten, and molybdenum, increasing the current density higher than for a conventionally (e.g., to 40 to 60 A/dm$^2$), and shortening the treatment time (e.g., to 0.1 to 1.3 seconds). If a roughened layer is not provided on the surface of the ultrathin copper layer, the adjustment can be carried out using a plating bath that contains Ni in a concentration twice or more that of other elements, and performing Ni alloy plating (e.g., Ni—W alloy plating, Ni—Co—P alloy plating, and Ni—Zn alloy plating) on the surface of the ultrathin copper layer, or a heat resistant layer, or an anti-corrosion layer, or a chromate-treated layer, or a silane coupling-treated layer by setting a lower current density than conventionally (e.g., 0.1 to 1.3 A/dm$^2$) and a longer treatment time (e.g., 20 seconds to 40 seconds).

Further, the method for fabricating a printed wiring board according to the present invention may be a method for fabricating a printed wiring board including: a step of laminating the ultrathin copper layer side surface or the carrier side surface of the copper foil provided with a carrier according to the present invention and a resin substrate; a step of providing two layers of a resin layer and a circuit at least one time on the surface of the copper foil provided with a carrier opposite to the ultrathin copper layer side surface or the carrier side surface with the resin substrate laminated thereon; and a step of, after the two layers of the resin layer and the circuit have been formed, peeling the carrier or the ultrathin copper layer from the copper foil provided with a carrier (coreless method). In a specific example of the coreless method, first, the ultrathin copper layer side surface or the carrier side surface of the copper foil provided with a carrier according to the present invention and a resin substrate are laminated to fabricate a laminate. Subsequently, a resin layer is formed on the surface of the copper foil provided with a carrier opposite to the ultrathin copper layer side surface or the carrier side surface with the resin substrate laminated thereon. A separate copper foil provided with a carrier may be laminated from the carrier side or the ultrathin copper layer side on the resin layer formed on the carrier side surface or the ultrathin copper layer side surface. Further, a laminate having a configuration in which a copper foil provided with a carrier is laminated on both surfaces of the resin substrate, which is positioned at the center, in an order of a carrier/an intermediate layer/an ultrathin copper layer or an ultrathin copper layer/an intermediate layer/a carrier, or a laminate having a configuration in which "a carrier/an intermediate layer/an ultrathin copper layer/a resin substrate/an ultrathin copper layer/an intermediate layer/a carrier" are laminated in this order may be used for the above-described method for fabricating a printed wiring board (coreless method). In addition, on the exposed surface of the ultrathin copper layer or the carrier at both ends of the laminate, a separate resin layer may be further provided to form a circuit by further providing a copper layer or metal layer and thereafter processing the copper layer or metal layer. A separate resin layer may be further provided on the circuit so as to bury the circuit. Further, such formation of a circuit and a resin layer may be carried out one or more times (build-up method). And for the laminate formed in this way (hereinafter, also referred to as laminate B), a coreless substrate can be produced by peeling the ultrathin copper layer or the carrier of each copper foil provided with a carrier from the carrier or the ultrathin copper layer. For producing the above-described coreless substrate, two copper foils provided with a carrier can be used to produce a laminate having a configuration of an ultrathin copper layer/an intermediate layer/a carrier/a carrier/an intermediate layer/an ultrathin copper layer, a laminate having a configuration of a carrier/an intermediate layer/an ultrathin copper layer/an ultrathin copper layer/an intermediate layer/a carrier, or a laminate having a configuration of a carrier/an intermediate layer/an ultrathin copper layer/a carrier/an intermediate layer/an ultrathin copper layer as described below to use the laminate as the center. A coreless substrate can be produced by providing two layers of a resin layer and a circuit one or more times on surfaces of the ultrathin copper layers or the carriers on both sides of these laminates (hereinafter, also referred to as laminate A), and, after the two layers of the resin layer and the circuit have been provided, peeling the ultrathin copper layer or the carrier of each copper foil provided with a carrier from the carrier or the ultrathin copper layer. The above-described laminate may have another layer on the surface of the ultrathin copper layer, on the surface of the carrier, between the carriers, between the ultrathin copper layers, or between the ultrathin copper layer and the carrier. In the present specification, in the case that an ultrathin copper layer, a carrier, or a laminate has another layer on the ultrathin copper layer surface, the carrier surface, or the laminate surface, "surface of an ultrathin copper layer," "ultrathin copper layer side surface," "ultrathin copper layer surface," "surface of a carrier," "carrier side surface," "carrier surface," "surface of a laminate," and "laminate surface" are a concept also including the surface (outermost surface) of the another layer. Further, the laminate preferably has a configuration of an ultrathin copper layer/an intermediate layer/a carrier/a carrier/an intermediate layer/an ultrathin copper layer. This is because, when a coreless substrate is produced using the laminate, the ultrathin copper layer is disposed on the coreless substrate side, which facilitates formation of a circuit on the coreless substrate using a modified semi-additive method. In addition, the reason is that, since the thickness of the ultrathin copper layer is small, it is easy to remove the ultrathin copper layer, which facilitates formation of a circuit on the coreless substrate using a semi-additive method after removing the ultrathin copper layer.

In the present specification, "laminate" which is not particularly stated as "laminate A" or "laminate B" indicates a laminate including at least a laminate A and a laminate B.

In the above-described method for fabricating a coreless substrate, when fabricating a printed wiring board using a build-up method, by covering a part or all of the edge face of the copper foil provided with a carrier or a laminate (laminate A) with a resin, the permeation of a chemical solution into the intermediate layer or a space between one copper foil provided with a carrier and another copper foil provided with a carrier constituting the laminate can be suppressed, and the separation of the ultrathin copper layer and the carrier and the corrosion of the copper foil provided with a carrier due to the permeation of a chemical solution can be prevented and yield can be improved. As the "resin covering a part or all of the edge face of the copper foil provided with a carrier" or the "resin covering a part or all of the edge face of the laminate" used here, a resin which can be used for the resin layer can be used. Further, in the above-described method for fabricating a coreless substrate, when the copper foil provided with a carrier or the laminate is viewed in a plane, at least a part of the periphery of a laminated part of the copper foil provided with a carrier or the laminate (a laminated part of a carrier and an ultrathin copper layer, or a laminated part of one copper foil provided with a carrier and another copper foil provided with a carrier) may be covered with a resin or a prepreg. Further, a laminate (laminate A) formed by using the above-described method for fabricating a coreless substrate may have a configuration in which a pair of copper foils provided with a carrier are contacted with each other in a separable manner. Furthermore, when the copper foil provided with a carrier is viewed in a plane, all of the periphery of a laminated part of the copper foil provided with a carrier or the laminate (a laminated part of a carrier and an ultrathin copper layer, or a laminated part of one copper foil provided with a carrier and another copper foil provided with a carrier) may be covered with a resin or a prepreg. By adopting such a configuration, when the copper foil provided with a carrier or the laminate is viewed in a plane, the laminated part of the copper foil provided with a carrier or the laminate is covered with a resin or a prepreg, and it can be prevented for another member to touch from the lateral direction of this part, that is, the transverse direction against the lamination direction, and as a result, the peeling of the carrier and the ultrathin copper layer or copper foils provided with a carrier can be less likely to occur in handling. Further, by covering the periphery of a laminated part of the copper foil provided with a carrier or the laminate with a resin or a prepreg so as not to expose it, the above-described permeation of a chemical solution into the interface of this laminated part in a chemical solution treatment step can be prevented, and the corrosion and erosion of the copper foil provided with a carrier can be prevented. It should be noted that, when one copper foil provided with a carrier is separated from a pair of copper foils provided with a carrier of the laminate or when the carrier and the copper foil (ultrathin copper layer) of the copper foil provided with a carrier are separated from each other, the laminated part of the copper foil provided with a carrier or the laminate (the laminated part of the carrier and the ultrathin copper layer, or the laminated part of one copper foil provided with a carrier and another copper foil provided with a carrier) covered with a resin or a prepreg needs to be removed by cutting or the like.

The copper foil provided with a carrier according to the present invention may be laminated from the carrier side or the ultrathin copper layer side on the carrier side or the ultrathin copper layer side of another copper foil provided with a carrier according to the present invention to constitute a laminate. Further, the laminate may be a laminate obtained by directly laminating as necessary via an adhesive the carrier side surface or the ultrathin copper layer side surface of the one copper foil provided with a carrier and the carrier side surface or the ultrathin copper layer side surface of the another copper foil provided with a carrier. Furthermore, the carrier or the ultrathin copper layer of the one copper foil provided with a carrier and the carrier or the ultrathin copper layer of the another copper foil provided with a carrier may be bonded together. Here, in the case that the carrier or the ultrathin copper layer has a surface-treated layer, the "bonding" includes a mode in which they are bonded together via the surface-treated layer. In addition, a part or all of the edge face of the laminate may be covered with a resin.

Lamination of carriers can be carried out by simply stacking or, for example, by using the following methods.

(a) metallurgical bonding method: fusion welding (arc welding, TIG (tungsten/inert gas) welding, MIG (metal/inert gas) welding, resistance welding, seam welding, spot welding), pressure welding (ultrasonic welding, friction stir welding), and brazing and soldering;
(b) mechanical bonding method: caulking, bonding with a rivet (bonding with a self-piercing rivet and bonding with a rivet), and a stitcher; and
(c) physical bonding method: an adhesive and a (double-sided) adhesive tape.

By bonding a part or all of one carrier and a part or all of the other carrier together using the above bonding method, a laminate having a configuration in which one carrier and the other carrier are laminated and contacted with each other in a separable manner can be fabricated. If one carrier and the other carrier are laminated in a state that one carrier and the other carrier are weakly bonded together, one carrier and the other carrier are separable from each other even without removing the bonding part of one carrier and the other carrier. On the other hand, if one carrier and the other carrier are strongly bonded together, one carrier and the other carrier can be separated from each other by removing the part to which one carrier and the other carrier bonds by cutting, chemical polishing (e.g., etching), mechanical polishing, or the like.

In addition, a printed wiring board can be produced by performing a step of providing two layers of a resin layer and a circuit at least one time on the laminate configured in this way, and a step of, after the two layers of the resin layer and the circuit have been formed at least one time, peeling the ultrathin copper layer or the carrier from the copper foil provided with a carrier of the laminate. Further, two layers of a resin layer and a circuit may be provided on the surface of one side or both sides of the laminate.

The resin substrate, resin layer, resin or prepreg to be used for the above-described laminate may be the resin layer described herein, and may include resins used for the resin layer described herein, resin curing agents, compounds, curing accelerators, dielectrics, reaction catalysts, cross-linking agents, polymers, prepregs, skeletal materials, and the like. Further, the copper foil provided with a carrier may be smaller than the resin or prepreg when being viewed in a plane.

EXAMPLES

Hereinafter, the present invention will be described in more detail using Examples of the present invention, but the present invention is never limited to these Examples in any way.

1. Fabrication of Copper Foil Provided with Carrier

A long copper foil or aluminum foil or polyimide film having a thickness listed in Tables 1 and 4 was prepared as a carrier. For "Electrolytic copper foil", "Rolled copper foil" and "Aluminum foil" in Tables were used an electrolytic copper foil manufactured by JX Nippon Mining & Metals Corporation, a Tough Pitch Copper foil manufactured by JX Nippon Mining & Metals Corporation and a commercially available aluminum foil of alloy number 1N30 defined in JIS H4160 1994, respectively. For "Polyimide film" was used a polyimide film obtained by soaking a polyimide film (Apical NPI manufactured by Kaneka Corporation) in an aqueous solution containing 3 mol/L of hydrazine monohydrate and 3 mol/L of sodium hydroxide at 25° C. for 60 seconds to hydrophilize the surface and thereafter soaking in 1 mol/L of an aqueous sodium hydroxide solution at 25° C. for 30 seconds.

Further, the surface roughness Rt of the carrier on the side to be provided with an ultrathin copper layer had been measured using a non-contact roughness meter (LEXT OLS 4000 manufactured by OLYMPUS CORPORATION) in accordance with JIS B0601-2001. Furthermore, the surface roughness Rz had been measured using a non-contact roughness meter (LEXT OLS 4000 manufactured by OLYMPUS CORPORATION) in accordance with JIS B0601-1994.

Measurement Conditions
Cutoff: none
Reference length: 257.9 μm
Reference area: 66,524 μm$^2$
Temperature of measurement environment: 23 to 25° C.

The respective formation treatments listed in Tables to form a peel layer (intermediate layer), an ultrathin copper layer and a roughened particle layer were performed for the shiny surface of this copper foil in a roll-to-roll continuous line under the following conditions. Here, Examples 1 to 36 were produced with the conveying system shown in FIG. 1. Comparative Examples 1 to 34 were produced with an embodiment of apparatus selected from a drum type and a zigzag type as listed in Tables.

Formation of Peel Layer (Intermediate Layer)
(A) Zigzag Type Foil-Conveying System
Anode: nonsoluble electrode
Cathode: treated carrier surface
Interelectrode distance: 50 mm
Carrier conveying tension: 0.05 kg/mm
(B) Drum Type Foil-conveying System
Anode: nonsoluble electrode
Cathode: carrier surface supported by a drum with a diameter of 100 cm
Interelectrode distance: 10 mm
Carrier conveying tension: 0.05 kg/mm An expression in the column "Type of Intermediate Layer" in the column "Formation of Intermediate Layer" in Tables means that a corresponding treatment in the following was performed. For example, "Ni/organic substance" means that a nickel plating treatment was performed followed by an organic substance treatment.

"Ni": nickel plating
(Solution composition) nickel sulfate: 270 to 280 g/L, nickel chloride: 35 to 45 g/L, nickel acetate: 10 to 20 g/L, trisodium citrate: 15 to 25 g/L, gloss agent: Saccharine, butynediol etc., sodium dodecyl sulfate: 55 to 75 ppm
(pH) 4 to 6
(Solution temperature) 55 to 65° C.
(Current density) 1 to 11 A/dm$^2$
(Conduction time) 1 to 20 seconds "Chromate": electrolytic pure chromate treatment
(Solution composition) potassium dichromate: 1 to 10 g/L
(pH) 7 to 10
(Solution temperature) 40 to 60° C.
(Current density) 0.1 to 2.6 A/dm$^2$
(Quantity of coulomb) 0.5 to 90 As/dm$^2$
(Conduction time) 1 to 30 seconds "Organic Substance": organic substance layer formation treatment
The organic substance layer formation treatment was carried out by showering and spraying with an aqueous solution having a solution temperature of 40° C. and a pH of 5 that included carboxybenzotriazole (CBTA) in a concentration of 1 to 30 g/L for 20 to 120 seconds.

"Ni—Mo": nickel-molybdenum alloy plating (Solution composition) Ni sulfate hexahydrate: 50 g/dm³, sodium molybdate dihydrate: 60 g/dm³, sodium citrate: 90 g/dm³
(Solution temperature) 30° C.
(Current density) 1 to 4 A/dm²
(Conduction time) 3 to 25 seconds
"Cr": chromium plating
(Solution composition) $CrO_3$: 200 to 400 g/L, $H_2SO_4$: 1.5 to 4 g/L
(pH) 1 to 4
(Solution temperature) 45 to 60° C.
(Current density) 10 to 40 A/dm²
(Conduction time) 1 to 20 seconds
"Co—Mo": Cobalt-molybdenum alloy plating
(Solution composition) Co sulfate: 50 g/dm³, sodium molybdate dihydrate: 60 g/dm³, sodium citrate: 90 g/dm³
(Solution temperature) 30 to 80° C.
(Current density) 1 to 4 A/dm²
(Conduction time) 3 to 25 seconds
"Ni—P": nickel-phosphorous alloy plating
(Solution composition) Ni: 30 to 70 g/L, P: 0.2 to 1.2 g/L
(pH) 1.5 to 2.5
(Solution temperature) 30 to 40° C.
(Current density) 1.0 to 10.0 A/dm²
(Conduction time) 0.5 to 30 seconds
"Cr (Sputtering)/Cr Oxide": chromium plating+surface oxidation
A Cr layer with 10 nm was formed by means of Cr sputtering. Thereafter, the Cr-sputtered layer was treated in a chamber with an oxygen gas atmosphere to form a chromium oxide on the surface.
"Electroless Ni": electroless Ni plating
The carrier surface was subjected to the following catalytic activation treatment, and thereafter the following electroless Ni plating was carried out.
Catalytic activation treatment
(Solution composition) palladium chloride: 0.1 to 0.3 g/L, stannous chloride 10 to 20 g/L, hydrochloric acid 150 to 250 g/L
(Solution temperature) 30 to 40° C.
(Time) 60 to 180 seconds
Electroless Ni plating
(Bath composition) $NiCl_2 \cdot 6H_2O$: 0.08 to 0.12 mol/L, $NaH_2PO_2 \cdot H_2O$: 0.08 to 0.12 mol/L, sodium citrate: 0.16 to 0.24 mol/L
(pH) 6 to 6.3
(Solution temperature) 80 to 85° C.
(Time) 30 to 90 seconds
Formation of Ultrathin Copper Layer
  (A) Zigzag Type Foil-conveying System
  Anode: nonsoluble electrode
  Cathode: treated carrier surface
  Interelectrode distance: 50 mm
  Composition of electrolytic plating solution: (shown in Tables 2, 5 and 7 to 12)
  Bath temperature in electrolytic plating: (shown in Tables 2, 5 and 7 to 12)
  Current density in electrolytic plating: (shown in Tables 2, 5 and 7 to 12)
  Carrier conveying tension: 0.05 kg/mm
  (B) Drum Type Foil-conveying System
  Anode: nonsoluble electrode
  Cathode: carrier surface supported by a drum with a diameter of 100 cm
  Interelectrode distance: 10 mm
  Composition of electrolytic plating solution: (shown in Tables 2, 5 and 7 to 12)
  Bath temperature in electrolytic plating: (shown in Tables 2, 5 and 7 to 12)
  Current density in electrolytic plating: (shown in Tables 2, 5 and 7 to 12)
  Carrier conveying tension: 0.05 kg/mm
  (C) Improved Zigzag Type Foil-conveying System
  Anode: nonsoluble electrode
  Cathode: treated carrier surface
  Interelectrode distance: 10 mm
  Composition of electrolytic plating solution: (shown in Tables 2, 5 and 7 to 12)
  Bath temperature in electrolytic plating: (shown in Tables 2 5 and 7 to 12)
  Current density in electrolytic plating: (shown in Tables 2, 5 and 7 to 12)
  Carrier conveying tension: 0.20 kg/mm
  A support roll was provided between conveying rolls to make the distance between the rolls in forming an ultrathin copper layer ½ (about 800 to 1,000 mm) of that in the common case.

In Tables, an example which has an expression only in the column "Formation of Ultrathin Copper Layer 1" among the columns "Formation of Ultrathin Copper Layer 1" and "Formation of Ultrathin Copper Layer 2" is an example in which only "Formation of Ultrathin Copper Layer 1" was carried out, and an example which has an expression also in the column "Formation of Ultrathin Copper Layer 2" is an example in which "Formation of Ultrathin Copper Layer 1" was carried out and then "Formation of Ultrathin Copper Layer 2" was further carried out.

Amine compound 4 in Conditions for Forming Ultrathin Copper Layer No. 21 in Table 11 is the amine compound described as the above general formula (F). Amine compound 6 in Conditions for Forming Ultrathin Copper Layer No. 23 in Table 12 is the amine compound described as the above general formula (N).

Formation of Roughened Layer
  (A) Zigzag Type Foil-conveying System
  Anode: nonsoluble electrode
  Cathode: treated carrier surface
  Interelectrode distance: 50 mm
  Carrier conveying tension: 0.05 kg/mm
  (B) Drum Type Foil-conveying System
  Anode: nonsoluble electrode
  Cathode: carrier surface supported by a drum with a diameter of 100 cm
  Interelectrode distance (shown in Tables)
  Composition of electrolytic plating solution: (Cu: 20 g/L, $H_2SO_4$: 50 g/L)
  Bath temperature in electrolytic plating: 40° C.
  Current density in electrolytic plating: 30 A/dm²
  Carrier conveying tension: 0.05 kg/mm "1" and "2" in "Roughening Treatment Conditions" in Tables represent the following treatment conditions, respectively.
  (1) Roughening Conditions "1"
(Solution Composition)
Cu: 10 to 20 g/L
Ni: 5 to 15 g/L
Co: 5 to 15 g/L
(Electroplating Conditions)
Temperature: 25 to 60° C.
Current density: 35 to 55 A/dm²
Quantity of coulomb for roughening: 5 to 50 As/dm²
Plating time: 0.1 to 1.4 seconds (2) Roughening Conditions "2"
Composition of electrolytic plating solution: (Cu: 10 g/L, $H_2SO_4$: 50 g/L)
Bath temperature in electrolytic plating: 40° C.
Current density in electrolytic plating: 20 to 40 A/dm$^2$
Quantity of coulomb for roughening: 2 to 56 As/dm$^2$
Plating time: 0.1 to 1.4 seconds
Drying Step In Examples, showering with water or a plating solution was performed for preventing drying out after carrying a carrier on which an intermediate layer (peel layer) had been formed out of an electroplating bath and before carrying the carrier into an electroplating bath for a next step of forming an ultrathin copper layer, and during formation of an ultrathin copper layer, and after carrying the carrier on which the ultrathin copper layer had been formed out of the electroplating bath and before carrying the carrier into an electroplating bath for a next step of forming a roughened layer.

On the other hand, in Comparative Example which has the expression "Yes" in the column "Drying After Forming Intermediate Layer and Before Forming Ultrathin Copper Layer" or the column "Drying" in the column "Formation of Ultrathin Copper Layer 1" or the column "Drying" in the column "Formation of Ultrathin Copper Layer 2" in Tables, showering was not performed but natural drying with an air was performed in the course of conveying from an electroplating bath to an electroplating bath for a next step as described above in the "Drying After Forming Intermediate Layer and Before Forming Ultrathin Copper Layer", "Formation of Ultrathin Copper Layer 1" and "Formation of Ultrathin Copper Layer 2".

Formation of Heat Resistant Layer
"Cu—Zn": Copper-Zinc Alloy Plating
(Solution Composition)
NaOH: 40 to 200 g/L
NaCN: 70 to 250 g/L
CuCN: 50 to 200 g/L
Zn(CN)$_2$: 2 to 100 g/L
As$_2$O$_3$: 0.01 to 1 g/L
(Solution Temperature)
40 to 90° C.
(Current Conditions)
Current density: 1 to 50 A/dm$^2$
Plating time: 1 to 20 seconds
"Ni—Zn": Nickel-zinc Alloy Plating
Solution composition: nickel 2 to 30 g/L, zinc 2 to 30 g/L
pH: 3 to 4
Solution temperature: 30 to 50° C.
Current density: 1 to 2 A/dm$^2$
Quantity of coulomb: 1 to 2 As/dm$^2$
"Zn": Zinc Plating
Solution composition: zinc 15 to 30 g/L
pH: 3 to 4
Solution temperature: 30 to 50° C.
Current density: 1 to 2 A/dm$^2$
Quantity of coulomb: 1 to 2 As/dm$^2$
Formation of Anti-Corrosion Layer
"Chromate": chromate treatment
K$_2$Cr$_2$O$_7$ (Na$_2$Cr$_2$O$_7$ or CrO$_3$): 2 to 10 g/L
NaOH or KOH: 10 to 50 g/L
ZnOH or ZnSO$_4$.7H$_2$O: 0.05 to 10 g/L
pH: 7 to 13
Bath temperature: 20 to 80° C.
Current density: 0.05 to 5 A/dm$^2$
Time: 5 to 30 seconds
Formation of Silane Coupling-Treated Layer After spray-coating with a 0.1 vol % to 0.3 vol % aqueous solution of 3-glycidoxypropyltrimethoxysilane, drying/heating was performed in an air at 100 to 200° C. for 0.1 to 10 seconds.

2. Evaluation of Copper Foil Provided with Carrier

Evaluations were performed using the following methods for each of the copper foils provided with a carrier obtained as described above.

Measurement of Ultrathin Copper Layer Thickness by Gravimetric Method

After the weight of a copper foil provided with a carrier was measured, the ultrathin copper layer was peeled off to measure the weight of the carrier, and the difference between the former and the latter was defined as the weight of the ultrathin copper layer.

Size of sample: 10 cm square sheet (a 10 cm square sheet stamped out with a press machine)
Sampling: arbitrary 3 points
The thickness of an ultrathin copper layer by a gravimetric method was calculated using the following formula.

Thickness (μm) of ultrathin copper layer by gravimetric method={(weight (g/100 cm$^2$) of copper foil with carrier in 10 cm square sheet)−(weight (g/100 cm$^2$) of carrier after peeling ultrathin copper layer from the copper foil provided with carrier in 10 cm square sheet)}/density of copper (8.96 g/cm$^3$)×0.01(100 cm$^2$/cm$^2$)×10,000 μm/cm In measurement of the weight of a sample, a precise balance which enables measurement to four decimal places was used. Then, the obtained weight measurement was directly used in the above calculation.

The arithmetic average value of the thicknesses of an ultrathin copper layer by a gravimetric method at three points was defined as the thickness of the ultrathin copper layer by a gravimetric method.

An IBA-200 manufactured by AS ONE Corporation was used as the precise balance and an HAP-12 manufactured by Noguchi Press Co., Ltd. was used as the press machine.

In the case that a surface-treated layer such as a roughened layer was formed above an ultrathin copper layer, the above measurement was carried out after forming the surface-treated layer.

Pinhole

The surface on the ultrathin copper layer side of a copper foil provided with a carrier was pasted on a BT resin (triazine-bismaleimide resin, manufactured by MITSUBISHI GAS CHEMICAL COMPANY, INC.) and heated and pressure-bonded at 220° C. and 20 kg/cm$^2$ for 2 hours. Next, while holding the sample of the copper foil provided with a carrier by hand with the carrier side facing up, the carrier was peeled from the ultrathin copper layer by hand not forcibly with care so as not to break the ultrathin copper layer during the peeling. Subsequently, the number of pinholes in the ultrathin copper layer surface above the BT resin (triazine-bismaleimide resin, manufactured by MITSUBISHI GAS CHEMICAL COMPANY, INC.) was visually counted for five samples having a size of 250 mm×250 mm using a consumer photographing backlight as a light source. Then, the number of pinholes per unit area (m$^2$) was calculated using the following formula.

Number of pinholes per unit area (m$^2$) (pinholes/m$^2$)
=total number of pinholes counted for 5 samples having size of 250 mm×250 mm/total area of observed surface regions (5 samples× 0.0625 m$^2$/sample)

Wirability (Wiring Formation Ability)

The following resin base material of 6.25 cm square having a thickness of 100 μm was prepared, and the resin base material and a copper foil provided with a carrier were lamination-pressed so that the surface on the ultrathin copper layer side of the copper foil provided with a carrier was contacted with the resin base material. The lamination press was carried out under conditions: pressing pressure: 3 MPa; and heating temperature and time: 220° C.×2 hours.

Resin used: GHPL-830MBT manufactured by MITSUBISHI GAS CHEMICAL COMPANY, INC.

Next, the carrier of the copper foil provided with a carrier on the resin base material was peeled off, and a DF (dry film) patterning treatment was then performed using the following treatment steps and treatment conditions.

DF laminating step: An RY-5325 manufactured by Hitachi Chemical Co., Ltd. was used as a DF, and the DF was pasted on the above micro-etched surface. The temperature, pressure and rotation speed of the laminate roll used for the pasting were 110° C., 0.4 MPa and 1.0 m/min, respectively.

DF exposure step: An exposure mask of L (line)/S (space)=21 μm/9 μm was used and a light was irradiated on the DF through the exposure mask. The DF used was that of negative type and a part irradiated with the light was photo-cured. The amount of exposure was 100 mJ/cm$^2$.

DF development step: Spray etching with an aqueous solution of sodium carbonate (developing solution) was performed for development to remove the part which had not been irradiated with the light in the above exposure step by dissolving it in the developing solution. The concentration of sodium carbonate, spraying pressure and spraying time were 1 wt/vol %, 0.16 MPa and 36 seconds, respectively.

Water-washing step: Water was sprayed with a spray to water-wash the development-treated surface. The spraying pressure and spraying time were 0.16 MPa and 36 seconds, respectively.

Next, the ultrathin copper layer surface was subjected to copper pattern plating with a treatment solution having the following plating solution composition.

Composition of Copper Pattern Plating Solution

Copper sulfate pentahydrate: 100 g/L

Sulfuric acid: 180 g/L

Chlorine ion: 50 ppm

Additive: CU-BRITE-RF manufactured by JCU CORPORATION, a proper amount

The additive was used for the purpose of improving the gloss and smoothness of the plating surface.

Next, the DF was peeled off using a sodium hydroxide solution. The concentration of sodium hydroxide, solution temperature and treatment time were 3 wt/vol %, 55° C. and 5 minutes, respectively.

Subsequently, the ultrathin copper layer surface was subjected to flush etching under the following conditions.

(Etching Conditions)

Etching method: spray etching

Spray nozzle: full-cone type

Spraying pressure: 0.10 MPa

Etching solution temperature: 30° C.

Etching solution composition:

$H_2O_2$ 18 g/L $H_2SO_4$ 92 g/L

Cu 8 g/L

Additive FE-830 II W3C manufactured by JCU CORPORATION, a proper amount

Treatment time [10 to 200 seconds]

In the above evaluation of wirability (wiring formation ability), photomicrographs of the appearance of an upper surface were taken for each of Examples and Comparative Examples. The photomicrographs (magnification: ×500) taken were one focusing on the top surface of a wiring and one focusing on the bottom surface of a wiring, respectively. Examples of the observation photograph of the appearance of a residue (L/S=15 μm/15 μm pitch part) between wires after flush etching of a wiring are shown in FIG. 6.

The width of the top surface of a wiring formed was measured in the observation photograph focusing on the bottom surface of the wiring at the time that removal of a copper residue between the wires on the resin surface was completed, and evaluated using the following criteria.

Evaluation Criteria double-circle double-circle double-circle: the wiring width was 15.9 μm or more double-circle double-circle: the wiring width was 15.6 μm or more and less than 15.9 μm double-circle: the wiring width was 15.3 μm or more and less than 15.6 μm circle circle: the wiring width was 15 μm or more and less than 15.3 μm circle: the wiring width was 10 μm or more and less than 15 μm X-mark: the wiring width was less than 10 μm Disconnection Rate For each of Examples and Comparative Examples, 250 circuits having L/S=15 μm/15 μm pitch in a size of 6.25 cm square (circuit length: 6 cm, 2,000 lines) were formed using the same method as in the above-described evaluation of wirability (wiring formation ability), and thereafter the resistance value of each of the sample circuits was measured using a digital multimeter. And then, in the case that the resistance value measured for a sample circuit using the digital multimeter was 150 or more based on the resistance value in the case of a circuit with no disconnection as 100, the circuit was determined to have a disconnection. Here, whether a circuit had disconnection was determined by checking the total length of the circuit using a photomicroscope (magnification: ×100). Subsequently, the disconnection rate was calculated using the following formula.

Disconnection rate (%)=number of samples determined to have disconnection/total number of samples (250)×100 Productivity In the case that the time (min/m$^2$) required for forming a unit area (1 m$^2$) of an ultrathin copper layer of a copper foil provided with a carrier is 15 minutes or shorter, the productivity was determined to be good, and in the case of longer than 15 minutes, the productivity was determined to be not good.

circle: 15 min/m$^2$ or shorter

X-mark: longer than 15 min/m$^2$

The production conditions and evaluation results for Examples and Comparative Examples are shown in Tables 1 to 12.

TABLE 1

| | Carrier | | | | | | | Drying After Forming Intermediate Layer and Before Forming Ultrathin Copper Layer |
|---|---|---|---|---|---|---|---|---|
| | Carrier Thickness (mm) | Type | Surface Roughness Rt of Carrier on Ultrathin Copper Layer Side (μm) | Surface Roughness Rz of Carrier on Ultrathin Copper Layer Side (μm) | Formation of Intermediate Layer | | | |
| | | | | | Formation Method | Embodiment of Plating Apparatus | Type of Intermediate Layer | |
| Example 1 | 35 | Electrolytic copper foil | 1.5 | 1.1 | Electroplating | Drum | Ni/chromate | No |
| Example 2 | 35 | Electrolytic copper foil | 1.5 | 1.1 | Electroplating | Drum | Ni/chromate | No |
| Example 3 | 18 | Electrolytic copper foil | 1.5 | 1.1 | Electroplating | Drum | Ni/chromate | No |
| Example 4 | 18 | Electrolytic copper foil | 1.5 | 1.1 | Electroplating | Drum | Ni/chromate | No |
| Example 5 | 70 | Electrolytic copper foil | 1.5 | 1.1 | Electroplating | Drum | Ni/chromate | No |
| Example 6 | 12 | Electrolytic copper foil | 1.5 | 1.1 | Electroplating | Drum | Ni/chromate | No |
| Example 7 | 10 | Electrolytic copper foil | 1.5 | 1.1 | Electroplating | Drum | Ni/chromate | No |
| Example 8 | 35 | Electrolytic copper foil | 1.5 | 1.1 | Electroplating | Drum | Ni/chromate | No |
| Example 9 | 18 | Electrolytic copper foil | 1.5 | 1.1 | Electroplating | Drum | Ni/chromate | No |
| Example 10 | 18 | Electrolytic copper foil | 1.5 | 1.1 | Electroplating | Drum | Ni/chromate | No |
| Example 11 | 18 | Electrolytic copper foil | 1.5 | 1.1 | Electroplating | Drum | Ni/chromate | No |
| Example 12 | 18 | Electrolytic copper foil | 1.5 | 1.1 | Electroplating | Drum | Ni/chromate | No |
| Example 13 | 18 | Electrolytic copper foil | 1.5 | 1.1 | Electroplating | Drum | Ni/chromate | No |
| Example 14 | 18 | Electrolytic copper foil | 1.0 | 0.7 | Electroplating | Drum | Ni/organic substance | No |
| Example 15 | 18 | Electrolytic copper foil | 1.0 | 0.7 | Electroplating | Drum | Ni-Mo | No |
| Example 16 | 18 | Electrolytic copper foil | 1.0 | 0.7 | Electroplating | Drum | Cr | No |
| Example 17 | 18 | Electrolytic copper foil | 1.0 | 0.7 | Electroplating | Drum | Co-Mo | No |
| Example 18 | 18 | Electrolytic copper foil | 1.5 | 1.1 | Electroplating | Drum | Ni/chromate | No |
| Example 19 | 18 | Electrolytic copper foil | 1.5 | 1.1 | Electroplating | Drum | Ni-P | No |
| Example 20 | 18 | Electrolytic copper foil | 1.5 | 1.1 | Electroplating | Drum | Ni/chromate | No |
| Example 21 | 18 | Electrolytic copper foil | 1.5 | 1.1 | Electroplating | Drum | Ni/chromate | No |
| Example 22 | 18 | Electrolytic copper foil | 1.5 | 1.1 | Electroplating | Drum | Ni/chromate | No |
| Example 23 | 18 | Electrolytic copper foil | 1.5 | 1.1 | Electroplating | Drum | Ni/chromate | No |
| Example 24 | 18 | Electrolytic copper foil | 1.5 | 1.1 | Electroplating | Drum | Ni/chromate | No |
| Example 25 | 18 | Electrolytic copper foil | 1.5 | 1.1 | Electroplating | Drum | Ni/chromate | No |
| Example 26 | 18 | Electrolytic copper foil | 1.5 | 1.1 | Electroplating | Drum | Ni/chromate | No |
| Example 27 | 18 | Rolled copper foil | 0.42 | 0.27 | Electroplating | Drum | Ni/chromate | No |
| Example 28 | 18 | Electrolytic copper foil | 0.67 | 0.47 | Electroplating | Drum | Ni/chromate | No |
| Example 29 | 18 | Rolled copper foil | 0.42 | 0.27 | Electroplating | Drum | Ni/chromate | No |
| Example 30 | 18 | Electrolytic copper foil | 0.67 | 0.47 | Electroplating | Drum | Ni/chromate | No |
| Example 31 | 18 | Rolled copper foil | 0.42 | 0.27 | Electroplating | Drum | Ni/chromate | No |
| Example 32 | 18 | Electrolytic copper foil | 0.67 | 0.47 | Electroplating | Drum | Ni/chromate | No |
| Example 33 | 18 | Electrolytic copper foil | 1.5 | 1.1 | Electroplating | Drum | Ni/chromate | No |

TABLE 1-continued

| | Carrier | | | | | | Drying After Forming Intermediate Layer and Before Forming |
|---|---|---|---|---|---|---|---|
| | | | Surface Roughness Rt of Carrier on Ultrathin | Surface Roughness Rz of Carrier on Ultrathin | Formation of Intermediate Layer | | |
| | Carrier Thickness (mm) | Type | Copper Layer Side (µm) | Copper Layer Side (µm) | Formation Method | Embodiment of Plating Apparatus | Type of Intermediate Layer | Ultrathin Copper Layer |
| Example 34 | 18 | Electrolytic copper foil | 1.5 | 1.1 | Electroplating | Drum | Ni/chromate | No |
| Example 35 | 18 | Rolled copper foil | 0.42 | 0.27 | Electroplating | Drum | Ni/chromate | No |
| Example 36 | 50 | Polyimide film | 0.37 | 0.21 | Electroplating | Drum | Electroless Ni/chromate | No |

TABLE 2

| | Formation of Ultrathin Copper Layer 1 | | | | | | Formation of Ultrathin Copper Layer 2 | | | | | |
|---|---|---|---|---|---|---|---|---|---|---|---|---|
| | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (µm) | Drying | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (µm) | Drying |
| Example 1 | Electroplating | Drum | 1 | Yes | 1.5 | No | — | — | — | — | — | — |
| Example 2 | Electroplating | Drum | 1 | Yes | 1.3 | No | — | — | — | — | — | — |
| Example 3 | Electroplating | Drum | 1 | Yes | 1.2 | No | — | — | — | — | — | — |
| Example 4 | Electroplating | Drum | 1 | Yes | 1 | No | — | — | — | — | — | — |
| Example 5 | Electroplating | Drum | 1 | Yes | 0.9 | No | — | — | — | — | — | — |
| Example 6 | Electroplating | Drum | 1 | Yes | 0.8 | No | — | — | — | — | — | — |
| Example 7 | Electroplating | Drum | 1 | Yes | 0.7 | No | — | — | — | — | — | — |
| Example 8 | Electroplating | Drum | 1 | Yes | 0.6 | No | — | — | — | — | — | — |
| Example 9 | Electroplating | Drum | 1 | Yes | 0.5 | No | — | — | — | — | — | — |
| Example 10 | Electroplating | Drum | 1 | Yes | 0.4 | No | — | — | — | — | — | — |
| Example 11 | Electroplating | Drum | 1 | Yes | 0.3 | No | — | — | — | — | — | — |
| Example 12 | Electroplating | Drum | 1 | Yes | 0.2 | No | — | — | — | — | — | — |
| Example 13 | Electroplating | Drum | 1 | Yes | 0.15 | No | — | — | — | — | — | — |
| Example 13 | Electroplating | Drum | 1 | Yes | 0.1 | No | — | — | — | — | — | — |
| Example 14 | Electroplating | Drum | 2 | Yes | 1.2 | No | — | — | — | — | — | — |
| Example 15 | Electroplating | Drum | 3 | Yes | 1.0 | No | — | — | — | — | — | — |
| Example 16 | Electroplating | Drum | 4 | Yes | 0.5 | No | — | — | — | — | — | — |
| Example 17 | Electroplating | Drum | 5 | Yes | 0.1 | No | — | — | — | — | — | — |
| Example 18 | Electroplating | Drum | 6 | Yes | 0.5 | No | — | — | — | — | — | — |
| Example 19 | Electroplating | Drum | 16 | Yes | 0.3 | No | — | — | — | — | — | — |

TABLE 2-continued

| | Formation of Ultrathin Copper Layer 1 | | | | | | Formation of Ultrathin Copper Layer 2 | | | | | |
|---|---|---|---|---|---|---|---|---|---|---|---|---|
| | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (μm) | Drying | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (μm) | Drying |
| Example 20 | Electroplating | Drum | 17 | Yes | 0.4 | No | — | — | — | — | — | — |
| Example 21 | Electroplating | Drum | 18 | Yes | 0.3 | No | — | — | — | — | — | — |
| Example 22 | Electroplating | Drum | 19 | Yes | 0.4 | No | — | — | — | — | — | — |
| Example 23 | Electroplating | Drum | 20 | Yes | 0.3 | No | — | — | — | — | — | — |
| Example 24 | Electroplating | Drum | 21 | Yes | 0.4 | No | — | — | — | — | — | — |
| Example 25 | Electroplating | Drum | 22 | Yes | 0.3 | No | — | — | — | — | — | — |
| Example 26 | Electroplating | Drum | 23 | Yes | 0.4 | No | — | — | — | — | — | — |
| Example 27 | Electroplating | Drum | 3 | Yes | 1.0 | No | — | — | — | — | — | — |
| Example 28 | Electroplating | Drum | 3 | Yes | 1.0 | No | — | — | — | — | — | — |
| Example 29 | Electroplating | Drum | 3 | Yes | 1.0 | No | — | — | — | — | — | — |
| Example 30 | Electroplating | Drum | 3 | Yes | 1.0 | No | — | — | — | — | — | — |
| Example 31 | Electroplating | Drum | 3 | Yes | 1.0 | No | — | — | — | — | — | — |
| Example 32 | Electroplating | Drum | 3 | Yes | 1.0 | No | — | — | — | — | — | — |
| Example 33 | Electroplating | Zigzag (The tension was 4 times larger than that in the common case, and a support roll was provided between conveying rolls in forming an ultrathin copper layer to make the distance between the conveying rolls 1/2 of that in the common case. Inter-electrode distance: 10 mm) | 1 | Yes | 0.5 | No | — | — | — | — | — | — |
| Example 34 | Electroplating | Drum | 1 | Yes | 0.5 | No | Electroplating | Drum | 8 | No | 0.1 | No |
| Example 35 | Electroplating | Drum | 26 | Yes | 0.5 | No | Electroplating | Drum | 24 | Yes | 1.0 | No |
| Example 36 | Electroplating | Drum | 3 | Yes | 1 | No | — | — | — | — | — | — |

TABLE 3

| | Total Thickness of Ultrathin Copper Layer (μm) | Gloss at 60° of Ultrathin Copper Layer Surface (Before Forming Surface-Treated Layer) (TD) (%) | Roughening Treatment | | Heat Resistant Treatment | Anti-corrosion Treatment | Silane Coupling Treatment | Number of Pinholes (pinholes/m²) | Wirability | Disconnection Rate (%) | Productivity |
|---|---|---|---|---|---|---|---|---|---|---|---|
| | | | Embodiment of Plating Apparatus | Roughening Treatment Conditions | | | | | | | |
| Example 1 | 1.5 | 245 | Drum | 1 | Cu-Zn | Chromate | Yes | 0 | ○○ | 0 | ○ |
| Example 2 | 1.3 | 234 | Drum | 1 | Cu-Zn | Chromate | Yes | 0 | ○○ | 0 | ○ |
| Example 3 | 1.2 | 220 | Drum | 1 | Cu-Zn | Chromate | Yes | 0 | ○○ | 0 | ○ |
| Example 4 | 1.0 | 193 | Drum | 1 | Cu-Zn | Chromate | Yes | 0 | ◎ | 0 | ○ |
| Example 5 | 0.9 | 185 | Drum | 1 | Cu-Zn | Chromate | Yes | 0 | ◎◎ | 0 | ○ |
| Example 6 | 0.8 | 176 | Drum | 1 | Cu-Zn | Chromate | Yes | 0 | ◎◎ | 0 | ○ |
| Example 7 | 0.7 | 168 | Drum | 1 | Cu-Zn | Chromate | Yes | 0 | ◎◎ | 0 | ○ |
| Example 8 | 0.6 | 160 | Drum | 1 | Cu-Zn | Chromate | Yes | 0 | ◎◎◎ | 0 | ○ |
| Example 9 | 0.5 | 146 | Drum | 1 | Cu-Zn | Chromate | Yes | 0 | ◎◎◎ | 0 | ○ |
| Example 10 | 0.4 | 130 | Drum | 1 | Cu-Zn | Chromate | Yes | 0 | ◎◎◎ | 0 | ○ |
| Example 11 | 0.3 | 126 | Drum | 1 | Cu-Zn | Chromate | Yes | 0 | ◎◎◎ | 0 | ○ |
| Example 12 | 0.2 | 112 | Drum | 1 | Cu-Zn | Chromate | Yes | 3 | ◎◎◎ | 1 | ○ |
| Example 13 | 0.15 | 101 | Drum | 1 | Cu-Zn | Chromate | Yes | 3 | ◎◎◎ | 1 | ○ |
| Example 13 | 0.10 | 80 | Drum | 1 | Cu-Zn | Chromate | Yes | 3 | ◎◎◎ | 1 | ○ |
| Example 14 | 1.2 | 234 | Drum | 1 | Cu-Zn | Chromate | Yes | 0 | ○○ | 0 | ○ |
| Example 15 | 1.0 | 201 | Zigzag | 2 | — | — | — | 0 | ○○ | 0 | ○ |
| Example 16 | 0.5 | 154 | — | — | Cu-Zn | Chromate | Yes | 0 | ◎◎◎ | 0 | ○ |
| Example 17 | 0.1 | 90 | — | — | — | Chromate | Yes | 0 | ◎◎◎ | 0 | ○ |
| Example 18 | 0.5 | 156 | Drum | 1 | Cu-Zn | Chromate | Yes | 0 | ◎◎◎ | 0 | ○ |
| Example 19 | 0.3 | 119 | Drum | 1 | Cu-Zn | Chromate | Yes | 0 | ◎◎◎ | 0 | ○ |
| Example 20 | 0.4 | 129 | Drum | 1 | Ni-Zn | Chromate | Yes | 0 | ◎◎◎ | 0 | ○ |
| Example 21 | 0.3 | 117 | — | — | — | — | — | 0 | ◎◎◎ | 0 | ○ |
| Example 22 | 0.4 | 132 | Drum | 1 | Ni-Zn | Chromate | Yes | 0 | ◎◎◎ | 0 | ○ |
| Example 23 | 0.3 | 121 | Drum | 1 | Ni-Zn | Chromate | Yes | 0 | ◎◎◎ | 0 | ○ |
| Example 24 | 0.4 | 133 | Drum | 1 | Ni-Zn | Chromate | Yes | 0 | ◎◎◎ | 0 | ○ |
| Example 25 | 0.3 | 100 | Drum | 1 | Ni-Zn | Chromate | Yes | 15 | ◎◎◎ | 3 | ○ |
| Example 26 | 0.4 | 135 | Drum | 1 | Ni-Zn | Chromate | Yes | 0 | ◎◎◎ | 0 | ○ |
| Example 27 | 1.0 | 750 | — | — | — | Chromate | — | 0 | ◎ | 0 | ○ |
| Example 28 | 1.0 | 601 | — | — | — | — | Yes | 0 | ◎ | 0 | ○ |
| Example 29 | 1.0 | 750 | Drum | 1 | Cu-Zn | Chromate | Yes | 0 | ◎ | 0 | ○ |
| Example 30 | 1.0 | 601 | Drum | 1 | Cu-Zn | Chromate | Yes | 0 | ◎ | 0 | ○ |
| Example 31 | 1.0 | 750 | — | — | — | — | — | 0 | ◎ | 0 | ○ |
| Example 32 | 1.0 | 601 | — | — | — | — | — | 0 | ◎ | 0 | ○ |
| Example 33 | 0.5 | 146 | Drum | 1 | Cu-Zn | Chromate | Yes | 6 | ◎◎◎ | 1 | ○ |
| Example 34 | 0.6 | 101 | Drum | 1 | Cu-Zn | Chromate | Yes | 0 | ◎◎ | 0 | ○ |
| Example 35 | 1.5 | 729 | — | — | — | Chromate | Yes | 0 | ◎ | 0 | ○ |
| Example 36 | 1 | 760 | — | — | — | Chromate | — | 0 | ◎ | 0 | ○ |

TABLE 4

| | Carrier | | | | Formation of Intermediate Layer | | | Drying After Forming Intermediate Layer and Before Forming Ultrathin Copper Layer |
|---|---|---|---|---|---|---|---|---|
| | Carrier Thickness (mm) | Type | Surface Roughness Rt of Carrier on Ultrathin Copper Layer Side (μm) | Surface Roughness Rz of Carrier on Ultrathin Copper Layer Side (μm) | Formation Method | Embodiment of Apparatus | Type of Intermediate Layer | |
| Comparative Example 1 | 18 | Electrolytic copper foil | 1.5 | 1.1 | Electroplating | Drum | Ni/chromate | Yes |
| Comparative Example 2 | 18 | Electrolytic copper foil | 1.5 | 1.1 | Electroplating | Drum | Ni/chromate | No |
| Comparative Example 3 | 18 | Electrolytic copper foil | 2.0 | 1.5 | Electroplating | Drum | Ni/chromate | No |
| Comparative Example 4 | 18 | Electrolytic copper foil | 1.5 | 1.1 | Electroplating | Zigzag | Ni/chromate | No |
| Comparative Example 5 | 18 | Electrolytic copper foil | 1.9 | 1.5 | Electroplating | Zigzag | Cr | Yes |

TABLE 4-continued

| | Carrier | | | | Formation of Intermediate Layer | | | Drying After Forming Intermediate Layer and Before Forming Ultrathin Copper Layer |
|---|---|---|---|---|---|---|---|---|
| | Carrier Thickness (mm) | Type | Surface Roughness Rt of Carrier on Ultrathin Copper Layer Side (μm) | Surface Roughness Rz of Carrier on Ultrathin Copper Layer Side (μm) | Formation Method | Embodiment of Apparatus | Type of Intermediate Layer | |
| Comparative Example 6 | 18 | Electrolytic copper foil | 1.9 | 1.5 | Electroplating | Zigzag | Cr | Yes |
| Comparative Example 7 | 18 | Electrolytic copper foil | 1.9 | 1.5 | Electroplating | Zigzag | Cr | Yes |
| Comparative Example 8 | 18 | Electrolytic copper foil | 1.9 | 1.5 | Electroplating | Zigzag | Cr | Yes |
| Comparative Example 9 | 18 | Electrolytic copper foil | 1.9 | 1.5 | Electroplating | Zigzag | Cr | Yes |
| Comparative Example 10 | 18 | Electrolytic copper foil | 1.9 | 1.5 | Electroplating | Zigzag | Cr | Yes |
| Comparative Example 11 | 18 | Electrolytic copper foil | 1.9 | 1.5 | Electroplating | Zigzag | Cr | Yes |
| Comparative Example 12 | 18 | Electrolytic copper foil | 1.9 | 1.5 | Electroplating | Zigzag | Cr | Yes |
| Comparative Example 13 | 18 | Electrolytic copper foil | 1.9 | 1.5 | Electroplating | Zigzag | Cr | Yes |
| Comparative Example 14 | 18 | Electrolytic copper foil | 1.9 | 1.5 | Electroplating | Zigzag | Cr | Yes |
| Comparative Example 15 | 18 | Electrolytic copper foil | 1.9 | 1.5 | Electroplating | Zigzag | Cr | Yes |
| Comparative Example 16 | 18 | Electrolytic copper foil | 1.9 | 1.5 | Electroplating | Zigzag | Cr | Yes |
| Comparative Example 17 | 18 | Electrolytic copper foil | 1.9 | 1.5 | Electroplating | Zigzag | Cr | Yes |
| Comparative Example 18 | 18 | Electrolytic copper foil | 1.9 | 1.5 | Electroplating | Zigzag | Cr | Yes |
| Comparative Example 19 | 18 | Electrolytic copper foil | 1.9 | 1.5 | Electroplating | Zigzag | Cr | Yes |
| Comparative Example 20 | 18 | Electrolytic copper foil | 1.9 | 1.5 | Electroplating | Zigzag | Cr | Yes |
| Comparative Example 21 | 18 | Electrolytic copper foil | 1.5 | 0.8 | Electroplating | Zigzag | Cr | Yes |
| Comparative Example 22 | 18 | Electrolytic copper foil | 2.3 | 1.8 | Electroplating | Zigzag | Cr | Yes |
| Comparative Example 23 | 18 | Electrolytic copper foil | 1.5 | 0.8 | Electroplating | Zigzag | Cr | Yes |
| Comparative Example 24 | 18 | Electrolytic copper foil | 2.3 | 1.8 | Electroplating | Zigzag | Cr | Yes |
| Comparative Example 25 | 18 | Rolled copper foil | 0.82 | 0.43 | Electroplating | Zigzag | Cr | Yes |
| Comparative Example 26 | 13 | Rolled copper foil | 0.82 | 0.43 | Electroplating | Zigzag | Cr | Yes |
| Comparative Example 27 | 18 | Rolled copper foil | 0.82 | 0.43 | Electroplating | Zigzag | Cr | Yes |
| Comparative Example 28 | 18 | Rolled copper foil | 0.82 | 0.43 | Electroplating | Zigzag | Cr | Yes |
| Comparative Example 29 | 30 | Aluminum foil | 0.89 | 0.51 | — | — | — | Yes |
| Comparative Example 30 | 18 | Rolled copper foil | 0.42 | 0.27 | Sputtering | Drum | Cr (sputtering)/Cr oxide | Yes |
| Comparative Example 31 | 18 | Electrolytic copper foil | 0.67 | 0.47 | Sputtering | Drum | Cr (sputtering) | Yes |
| Comparative Example 32 | 18 | Electrolytic copper foil | 1.5 | 1.1 | Electroplating | Drum | Ni/chromate | Yes |
| Comparative Example 33 | 18 | Rolled copper foil | 0.42 | 0.27 | Electroplating | Drum | Ni/chromate | No |
| Comparative Example 34 | 18 | Rolled copper foil | 0.42 | 0.27 | Electroplating | Drum | Ni/chromate | No |

TABLE 5

| | Formation of Ultrathin Copper Layer 1 | | | | | | Formation of Ultrathin Copper Layer 2 | | | | | |
|---|---|---|---|---|---|---|---|---|---|---|---|---|
| | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (μm) | Drying | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (μm) | Drying |
| Comparative Example 1 | Electroplating | Drum | 1 | Yes | 0.5 | No | — | — | — | — | — | — |
| Comparative Example 2 | Electroplating | Zigzag | 1 | Yes | 0.5 | No | — | — | — | — | — | — |
| Comparative Example 3 | Electroplating | Drum | 1 | Yes | 0.5 | No | — | — | — | — | — | — |
| Comparative Example 4 | Electroplating | Drum | 1 | Yes | 0.5 | No | — | — | — | — | — | — |
| Comparative Example 5 | Electroless plating method | Zigzag | 7 | No | 1.0 | Yes | — | — | — | — | — | — |
| Comparative Example 6 | Sputtering method | Drum | 9 | — | 1.0 | Yes | — | — | — | — | — | — |
| Comparative Example 7 | Electroless plating method | Zigzag | 7 | No | 0.5 | Yes | Electroplating | Zigzag | 8 | No | 0.5 | Yes |
| Comparative Example 8 | Sputtering method | Drum | 9 | — | 0.5 | Yes | Electroplating | Zigzag | 8 | No | 0.5 | Yes |
| Comparative Example 9 | Electroless plating method | Zigzag | 7 | No | 1.0 | Yes | — | — | — | — | — | — |
| Comparative Example 10 | Sputtering method | Drum | 9 | — | 1.0 | Yes | — | — | — | — | — | — |
| Comparative Example 11 | Electroless plating method | Zigzag | 7 | No | 0.5 | Yes | Electroplating | Zigzag | 8 | No | 0.5 | Yes |
| Comparative Example 12 | Sputtering method | Drum | 9 | — | 0.5 | Yes | Electroplating | Zigzag | 8 | No | 0.5 | Yes |
| Comparative Example 13 | Electroless plating method | Zigzag | 7 | No | 0.9 | Yes | — | — | — | — | — | — |
| Comparative Example 14 | Sputtering method | Drum | 9 | — | 0.9 | Yes | — | — | — | — | — | — |
| Comparative Example 15 | Electroless plating method | Zigzag | 7 | No | 0.45 | Yes | Electroplating | Zigzag | 8 | No | 0.45 | Yes |
| Comparative Example 16 | Sputtering method | Drum | 9 | — | 0.45 | Yes | Electroplating | Zigzag | 8 | No | 0.45 | Yes |
| Comparative Example 17 | Electroless plating method | Zigzag | 7 | No | 0.9 | Yes | — | — | — | — | — | — |
| Comparative Example 18 | Sputtering method | Drum | 9 | — | 0.9 | Yes | — | — | — | — | — | — |
| Comparative Example 19 | Electroless plating method | Zigzag | 7 | No | 0.45 | Yes | Electroplating | Zigzag | 8 | No | 0.45 | Yes |
| Comparative Example 20 | Sputtering method | Drum | 9 | — | 0.45 | Yes | Electroplating | Zigzag | 8 | No | 0.45 | Yes |
| Comparative Example 21 | Electroplating | Zigzag | 10 | No | 0.25 | No | Electroplating | Zigzag | 11 | No | 2.75 | Yes |
| Comparative Example 22 | Electroplating | Zigzag | 12 | No | 0.5 | No | Electroplating | Zigzag | 13→14 | No | 2.5 | Yes |
| Comparative Example 23 | Electroplating | Zigzag | 10 | No | 0.2 | No | Electroplating | Zigzag | 11 | No | 1.3 | Yes |
| Comparative Example 24 | Electroplating | Zigzag | 12 | No | 0.4 | No | Electroplating | Zigzag | 13→14 | No | 1.1 | Yes |
| Comparative Example 25 | Electroplating | Zigzag | 10 | No | 0.25 | No | Electroplating | Zigzag | 11 | No | 2.75 | Yes |
| Comparative Example 26 | Electroplating | Zigzag | 10 | No | 0.2 | No | Electroplating | Zigzag | 11 | No | 1.3 | Yes |
| Comparative Example 27 | Electroplating | Zigzag | 10 | No | 0.2 | No | Electroplating | Zigzag | 11 | No | 0.8 | Yes |
| Comparative Example 28 | Electroplating | Zigzag | 10 | No | 0.2 | No | Electroplating | Zigzag | 11 | No | 0.7 | Yes |
| Comparative Example 29 | Sputtering method | Drum | 9 | — | 0.5 | Yes | Electroplating | Zigzag | 15 | No | 1.0 | Yes |

TABLE 5-continued

| | Formation of Ultrathin Copper Layer 1 | | | | | | Formation of Ultrathin Copper Layer 2 | | | | | |
|---|---|---|---|---|---|---|---|---|---|---|---|---|
| | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (μm) | Drying | Formation Method | Embodiment of Plating Apparatus | Conditions for Forming Ultrathin Copper Layer (Electrolyte Composition, etc.) | Correspondence to Gloss Copper Plating | Ultrathin Copper Layer Thickness (μm) | Drying |
| Comparative Example 30 | Electroplating | Drum | 3 | Yes | 1.0 | No | — | — | — | — | — | — |
| Comparative Example 31 | Electroplating | Drum | 3 | Yes | 1.0 | No | — | — | — | — | — | — |
| Comparative Example 32 | Electroplating | Drum | 1 | Yes | 0.1 | No | — | — | — | — | — | — |
| Comparative Example 33 | Electroplating | Drum | 25 | No | 0.5 | No | Electroplating | Drum | 24 | Yes | 1.5 | No |
| Comparative Example 34 | Electroplating | Drum | 25 | No | 0.5 | No | Electroplating | Drum | 24 | Yes | 1.0 | No |

TABLE 6

| | Total Thickness of Ultrathin Copper Layer (μm) | Gloss at 60° of Ultrathin Copper Layer Surface (Before Forming Surface-Treated Layer) (TD) (%) | Roughening Treatment | | | Heat Resistant Treatment | Anticorrosion Treatment | Silane Coupling Treatment | Number of Pinholes (pinholes/m²) | Wirability | Disconnection Rate (%) | Productivity |
|---|---|---|---|---|---|---|---|---|---|---|---|---|
| | | | Embodiment of Plating Apparatus | Roughening Treatment Conditions | | | | | | | | |
| Comparative Example 1 | 0.5 | 146 | Drum | 1 | | Cu-Zn | Chromate | Yes | 49 | ⊚⊚⊚ | 11 | ○ |
| Comparative Example 2 | 0.5 | 146 | Drum | 1 | | Cu-Zn | Chromate | Yes | 59 | ⊚⊚⊚ | 13 | ○ |
| Comparative Example 3 | 0.5 | 146 | Drum | 1 | | Cu-Zn | Chromate | Yes | 41 | ⊚⊚⊚ | 9 | ○ |
| Comparative Example 4 | 0.5 | 146 | Drum | 1 | | Cu-Zn | Chromate | Yes | 37 | ⊚⊚⊚ | 8 | ○ |
| Comparative Example 5 | 1.0 | 62 | — | — | | — | — | — | 8 | ⊚ | 3 | X |
| Comparative Example 6 | 1.0 | 64 | — | — | | — | — | — | 16 | ⊚ | 7 | X |
| Comparative Example 7 | 1.0 | 61 | — | — | | — | — | — | 9 | ⊚ | 5 | X |
| Comparative Example 8 | 1.0 | 59 | — | — | | — | — | — | 16 | ⊚ | 6 | X |
| Comparative Example 9 | 1.0 | 62 | Zigzag | 2 | | — | — | — | 8 | ⊚ | 3 | X |
| Comparative Example 10 | 1.0 | 64 | Zigzag | 2 | | — | — | — | 16 | ⊚ | 8 | X |
| Comparative Example 11 | 1.0 | 61 | Zigzag | 2 | | — | — | — | 9 | ⊚ | 3 | X |
| Comparative Example 12 | 1.0 | 59 | Zigzag | 2 | | — | — | — | 16 | ⊚ | 7 | X |
| Comparative Example 13 | 0.9 | 62 | — | — | | — | — | — | 21 | ⊚⊚ | 7 | X |
| Comparative Example 14 | 0.9 | 64 | — | — | | — | — | — | 45 | ⊚⊚ | 18 | X |
| Comparative Example 15 | 0.9 | 61 | — | — | | — | — | — | 26 | ⊚⊚ | 9 | X |
| Comparative Example 16 | 0.9 | 59 | — | — | | — | — | — | 53 | ⊚⊚ | 23 | X |
| Comparative Example 17 | 0.9 | 62 | Zigzag | 2 | | — | — | — | 21 | ⊚⊚ | 7 | X |
| Comparative Example 18 | 0.9 | 64 | Zigzag | 2 | | — | — | — | 44 | ⊚⊚ | 19 | X |

TABLE 6-continued

| | Total Thickness of Ultrathin Copper Layer (μm) | Gloss at 60° of Ultrathin Copper Layer Surface (Before Forming Surface-Treated Layer) (TD) (%) | Roughening Treatment Embodiment of Plating Apparatus | Roughening Treatment Conditions | Heat Resistant Treatment | Anti-corrosion Treatment | Silane Coupling Treatment | Number of Pinholes (pinholes/m²) | Wirability | Disconnection Rate (%) | Productivity |
|---|---|---|---|---|---|---|---|---|---|---|---|
| Comparative Example 19 | 0.9 | 61 | Zigzag | 2 | — | — | — | 26 | ◎◎ | 11 | X |
| Comparative Example 20 | 0.9 | 53 | Zigzag | 2 | — | — | — | 53 | ◎◎ | 21 | X |
| Comparative Example 21 | 3.0 | 59 | Zigzag | 2 | Zn | Chromate | — | 10 | X | 3 | ○ |
| Comparative Example 22 | 3.0 | 51 | Zigzag | 2 | Zn | Chromate | — | 6 | X | 4 | ○ |
| Comparative Example 23 | 1.5 | 59 | Zigzag | 2 | Zn | Chromate | — | 102 | ○○ | 21 | ○ |
| Comparative Example 24 | 1.5 | 51 | Zigzag | 2 | Zn | Chromate | — | 80 | ○○ | 18 | ○ |
| Comparative Example 25 | 3.0 | 69 | Zigzag | 2 | Zn | Chromate | — | 3 | X | 4 | ○ |
| Comparative Example 26 | 1.5 | 71 | Zigzag | 2 | Zn | Chromate | — | 29 | ○○ | 7 | ○ |
| Comparative Example 27 | 1.0 | 72 | Zigzag | 2 | Zn | Chromate | — | 59 | ◎ | 13 | ○ |
| Comparative Example 28 | 0.9 | 73 | Zigzag | 2 | Zn | Chromate | — | 109 | ◎◎ | 25 | ○ |
| Comparative Example 29 | 1.5 | 52 | — | — | Ni-Zn | Chromate | Amino Silane Coupling Treatment | 4445 | ○○ | 100 | X |
| Comparative Example 30 | 1.0 | 750 | Drum | 1 | Cu-Zn | Chromate | Yes | 25 | ◎ | 7 | ○ |
| Comparative Example 31 | 1.0 | 601 | Drum | 1 | Cu-Zn | Chromate | Yes | 39 | ◎ | 11 | ○ |
| Comparative Example 32 | 0.1 | 146 | Drum | 1 | Cu-Zn | Chromate | Yes | 191 | ◎◎◎ | 67 | ○ |
| Comparative Example 33 | 2.0 | 746 | — | — | — | Chromate | Yes | 35 | ◎ | 10 | ○ |
| Comparative Example 34 | 1.5 | 724 | — | — | — | Chromate | Yes | 52 | ◎ | 13 | ○ |

TABLE 7

| Conditions for Forming Ultrathin Copper Layer No | Solution Composition (ppm is ppm by mass in all cases) | | | | | | | |
|---|---|---|---|---|---|---|---|---|
| | Gloss Agent | | | | | | | |
| | Halide Ion | Sulfur-containing Organic Compound | Nitrogen-containing Organic Compound | High-molecular-weight Compound | Gloss Copper Plating or Not | Others | Other Conditions | |
| 1 | Cl⁻: 20 to 100 ppm | Bis(3-sulfopropyl) disulfide: 10 to 30 ppm | Amine compound 1: 10 to 30 ppm | — | Yes | Copper concentration: 80 to 120 g/L Sulfuric acid concentration: 80 to 120 g/L | The following amine compound was used as Amine compound 1 (wherein $R_1$ and $R_2$ are selected from the group consisting of a hydroxyalkyl group, an ether group, an aryl group, an aromatic-substituted alkyl group, an unsaturated hydrocarbon group, and an alkyl group). Electrolyte temperature: 50 to 80° C., Current density: 80 to 100 A/dm² | |

TABLE 7-continued

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| | | | | | | | 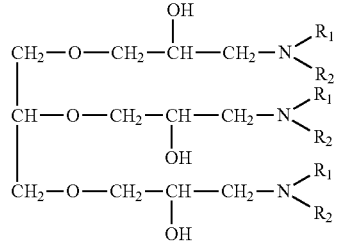 |
| 2 | Br⁻: 20 to 100 ppm | Sodium 3-mercapto-1-propanesulfonate: 10 to 50 ppm | Janus Green B: 10 to 50 ppm | — | Yes | Copper concentration: 80 to 120 g/L Sulfuric acid concentration: 80 to 120 g/L | Electrolyte temperature: 50 to 80° C. Current density: 80 to 100 A/dm² |
| 3 | Cl⁻ Concentration: 30 to 80 ppm | Bis(3-sulfopropyl) disulfide disodium concentration: 10 to 50 ppm | Dialkylamino group-containing polymer (weight average molecular weight 8,500): 10 to 50 ppm | — | Yes | Copper concentration: 30 to 120 g/L H₂SO₄ concentration: 20 to 120 g/L | Electrolyte temperature: 20 to 80° C. Current density: 10 to 100 A/dm² The structure of dialkylamino group-containing polymer 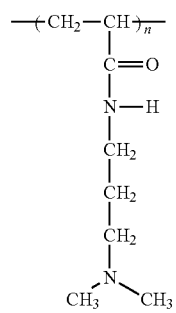 |

TABLE 8

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 4 | — | 2,5-dimercapto-1,2,4-thiadiazole: 10 to 50 ppm | Aqueous ammonia: 1 to 3 mL/L | — | Yes | Copper pyrophosphate: Cu₂P₂O₇·3H₂O: 80 to 115 g/L Potassium pyrophosphate: K₂P₂O₇: 250 to 400 g/L | Current density: 0.1 to 4.5 A/dm² Temperature: 40 to 70° C. pH: 8.0 to 9.0 Mass ratio of P₂O₇/Cu: 6.5 to 8.5 |

TABLE 8-continued

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 5 | Cl⁻: 20 to 100 ppm | Bis(3-sulfopropyl) disulfide: 10 to 30 ppm | Amine compound 1: 10 to 30 ppm | Polyethylene glycol (molecular weight 1,000): 10 to 300 ppm | Yes | Copper concentration: 80 to 120 g/L Sulfuric acid concentration: 80 to 120 g/L | The following amine compound was used as Amine compound 1 (wherein $R_1$ and $R_2$ are selected from the group consisting of a hydroxyalkyl group, an ether group, an aryl group, an aromatic-substituted alkyl group, an unsaturated hydrocarbon group, and an alkyl group). Electrolyte temperature: 50 to 80° C., Current density: 100 A/dm² |
| 6 | — | — | — | — | Yes Sodium selenite: 0.5 to 1 g/L | Copper cyanide (CuCN): 70 to 80 g/L Sodium cyanide (NaCN): 30 to 135 g/L Sodium hydroxide (NaOH): 10 to 20 g/L Free sodium cyanide: 10 to 20 g/L | Current density: 1 to 2 A/dm² Temperature: 60 to 65° C. |

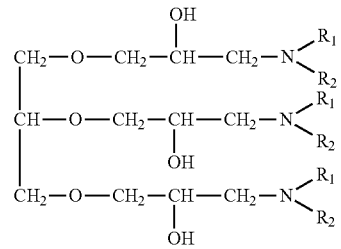

TABLE 9

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 7 | — | — | EDTA: 60 to 80 g/L 2,2'-Bipyridyl: 8 to 12 ppm | Polyethylene glycol (molecular weight 1,000): 80 to 120 ppm | No | — | Electroless plating Copper sulfate (CuSO₄·5H₂O): 7 to 8 g/L Glyoxylic acid: 16 to 20 g/L Bath temperature: 55 to 60° C. pH: 12 to 13 |
| 8 | Cl⁻: 20 to 40 ppm | — | Glue: 1 to 3 ppm | — | No | Copper sulfate (CuSO₄·5H₂O): 300 to 500 g/L Sulfuric acid (H₂SO₄): 80 to 140 g/L | Bath temperature: 45 to 55° C. |

TABLE 9-continued

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 9 | — | — | — | — | — | — | Sputtering method<br>Target: Cu concentration 99.999% by mass<br>Apparatus: sputtering machine manufactured by ULVAC, Inc.<br>Output: DC 50 W<br>Argon pressure: 0.2 Pa |
| 10 | — | — | — | — | No | $Cu_2P_2O_7 \cdot 3H_2O$: 16 g/L<br>$K_4P_2O_7$: 300 g/L | pH: 8<br>Current density: 1.5 A/dm$^2$<br>Plating time: 60 sec |
| 11 | — | — | — | — | No | Cu concentration: 55 g/L<br>$H_2SO_4$: 80 g/L | Current density: 5 A/dm$^2$ |
| 12 | — | — | — | — | No | $Cu_2P_2O_7 \cdot 3H_2O$: 30 g/L<br>$K_4P_2O_7$: 300 g/L | pH: 8<br>Current density: 1.5 A/dm$^2$<br>Plating time: 2 min |
| 13 | — | — | — | — | No | CuCN: 55 g/L<br>KCN: 70 g/L | Current density: 5.0 A/dm$^2$<br>Plating time: 0.5 min |
| 14 | — | — | — | — | No | $Cu_2P_2O_7 \cdot 3H_2O$: 85 g/L<br>$K_4P_2O_7$: 350 g/L<br>$NH_3OH$ (28%): 5 mL/L | pH: 8.5<br>Current density: 3 A/dm$^2$ |

TABLE 10

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 15 | — | — | — | — | No | Copper pyrophosphate: 56 g/L<br>Potassium pyrophosphate: 290 g/L | pH 8.5 (adjusted with potassium hydroxide)<br>Solution temperature 50° C.<br>An aluminum carrier on which a dry copper thin film had been formed was acid-washed with dilute sulfuric acid having a concentration of 100 g/L in advance, and the contact time of the aluminum carrier with the copper electrolyte was set to 5 minutes<br>Current density: 1 A/dm$^2$ |
| 16 | Cl$^-$: 20 to 100 ppm | Bis(3-sulfopropyl) disulfide: 10 to 30 ppm | Amine compound 1: 10 to 30 ppm | Polyethylene glycol (molecular weight 1,000): 10 to 300 ppm | Yes | Copper sulfamate: $(NH_2SO_3) \cdot 4H_2O$: 200 to 500 g/l<br>Sulfamic acid: 10 to 50 g/L | The following amine compound was used as Amine compound 1 (wherein $R_1$ and $R_2$ are selected from the group consisting of a hydroxyalkyl group, an ether group, an aryl group, an aromatic-substituted alkyl group, an unsaturated hydrocarbon group, and an alkyl group). Electrolyte temperature: 50 to 80° C., Current density: 1 to 15 A/dm$^2$ |

TABLE 10-continued

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 17 | Cl⁻: 20 to 70 ppm | Bis(3-sulfopropyl) disulfide: 10 to 30 ppm | Diallylmethlyamine hydrochloride-sulfur dioxide copolymer (P(DAMA·HCl—SO₂) (molecular weight 4,000): 1 to 3 ppm | Polyethylene glycol (molecular weight 1,000): 10 to 300 ppm | Yes | Copper concentration: 80 to 120 g/L Sulfuric acid concentration: 80 to 120 g/L | Electrolyte temperature: 50 to 80° C. Current density: 100A/dm² Diallylmethlyamine hydrochloride-sulfur dioxide copolymer |

Structure (Other Conditions, upper):

$$\begin{array}{l}
CH_2-O-CH_2-CH(OH)-CH_2-N(R_1)(R_2) \\
CH-O-CH_2-CH(OH)-CH_2-N(R_1)(R_2) \\
CH_2-O-CH_2-CH(OH)-CH_2-N(R_1)(R_2)
\end{array}$$

Structure (Diallylmethlyamine hydrochloride-sulfur dioxide copolymer):

$$\left[ \begin{array}{c} CH_2-CH(CH_2)-CH(CH_2)-CH_2 \\ \text{N-ring with HCl, CH}_3 \end{array} - SO_2 \right]_n$$

TABLE 11

| Conditions for Forming Ultrathin Copper Layer No | Solution Composition (ppm is ppm by mass in all cases) | | | | | | |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | Others | Other Conditions |
| 18 | I⁻: 20 to 70 ppm | Bis(3-sulfopropyl) disulfide: 10 to 30 ppm | Amine compound 3: 10 to 30 ppm | Polyethylene glycol (molecular weight 1,000): 10 to 300 ppm | Yes | Copper concentration: 80 to 120 g/L Sulfuric acid concentration: 80 to 120 g/L | Electrolyte temperature: 50 to 80° C. Current density: 100A/dm² Amine compound 3 |

Structure (Amine compound 3):

$$\begin{array}{l}
CH_2-CH(OH)-CH_2-O-(CH_2-)\\
\quad | \\
X_1^- \ N^+(R_1)(R_2)(R_3) \\
\\
-CH_2-O)_n-CH_2-CH(OH)-CH_2-N^+(R_1)(R_2)(R_3) \ X_1^-
\end{array}$$

(n: an integer of 1 to 22)

TABLE 11-continued

| Conditions for Forming Ultrathin Copper Layer No | Solution Composition (ppm is ppm by mass in all cases) | | | | | Others | Other Conditions |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | | |
| 19 | Cl⁻: 20 to 70 ppm | Bis(3-sulfopropyl) disulfide: 10 to 30 ppm | Phthalocyanine dye: 10 to 30 ppm | Glue: 1 to 3 ppm | Yes | Copper concentration: 80 to 120 g/L Sulfuric acid concentration: 80 to 120 g/L | Electrolyte temperature: 50 to 80° C. Current density: 100A/dm² Phthalocyanine dye |
| 20 | Cl⁻: 20 to 70 ppm | Bis(3-sulfopropyl) disulfide: 100 to 300 ppm | — | Polyethylene glycol (molecular weight 1,000): 10 to 300 ppm | Yes | Copper concentration: 80 to 120 g/L Sulfuric acid concentration: 80 to 120 g/L | Electrolyte temperature: 50 to 80° C. Current density: 100A/dm² |
| 21 | Cl⁻: 20 to 70 ppm | Thiourea: 1 to 10 ppm | Amine compound 4: 10 to 30 ppm | Polyethylene glycol (molecular weight 1,000): 10 to 300 ppm | Yes | Copper concentration: 80 to 120 g/L Sulfuric acid concentration: 80 to 120 g/L | Electrolyte temperature: 50 to 80° C. Current density: 100A/dm² Amine compound 4 |

TABLE 12

| Conditions for Forming Ultrathin Copper Layer No | Solution Composition (ppm is ppm by mass in all cases) | | | | | Others | Other Conditions |
|---|---|---|---|---|---|---|---|
| | Gloss Agent | | | | | | |
| | Halide Ion | Sulfur-containing Organic Compound | Nitrogen-containing Organic Compound | High-molecular-weight Compound | Gloss Copper Plating or Not | | |
| 22 | Cl⁻: 15 ppm | Bis(3-sulfopropyl) disulfide: 5 ppm | Amine compound 1: 8 ppm | Polyehtylene glycol (molecular weight 500): 8 ppm | Yes | Copper concentration: 80 to 120 g/L Sulfuric acid concentration: 80 to 120 g/L | Electrolyte temperature: 50 to 80° C. Current density: 90 A/dm² |
| 23 | Cl⁻: 20 to 70 ppm | Bis(3-sulfopropyl) disulfide: 10 to | Amine compound 6: 10 to | Polypropylene glycol (molecular weight 1,000): | Yes | Copper concentration: 80 to 120 g/L | Electrolyte temperature: 50 to 80° C. Current density: |

TABLE 12-continued

| Conditions for Forming Ultrathin Copper Layer No | Solution Composition (ppm is ppm by mass in all cases) | | | | | | |
|---|---|---|---|---|---|---|---|
| | | Gloss Agent | | | | | |
| | Halide Ion | Sulfur-containing Organic Compound | Nitrogen-containing Organic Compound | High-molecular-weight Compound | Gloss Copper Plating or Not | Others | Other Conditions |
| | | 10 to 30 ppm | 30 ppm | 10 to 300 ppm | | Sulfuric acid concentration: 80 to 120 g/L | 100 A/dm² Amine compound 6 |
| 24 | Cl⁻: 10 ppm | Sodium 3-mercapto-1-propanesulfonate: 5 ppm | — | Polyethylene glycol (molecular weight 2,000): 10 to 300 ppm | Yes | Copper concentration: 90 to 110 g/L Sulfuric acid concentration: 80 to 120 g/L | Temperature: 35 to 45° C. Current density: 7 A/dm² Plating time: 60 sec |
| 25 | — | Sodium 3-mercapto-1-propanesulfonate: 5 ppm | — | Polyethylene glycol (molecular weight 2,000): 10 to 300 ppm | No | Cu₂P₂O₇·3H₂O: 16 g/L K₄P₂O₇: 300 g/L | pH: 6.0 Current density: 0.5 A/dm² Plating time: 20 sec Temperature: 35 to 45° C. |
| 26 | — | Sodium 3-mercapto-1-propanesulfonate: 5 ppm | Aqueous ammonia: 1-3 mL/L | Polyethylene glycol (molecular weight 2,000): 10 to 300 ppm | Yes | Cu₂P₂O₇·3H₂O: 16 g/L K₄P₂O₇: 300 g/L | pH: 8.0 Current density: 0.5 A/dm² Plating time: 20 sec Temperature: 35 to 45° C. |

Evaluation Result

The circuit formability was good and the disconnection rate was low in any of Examples 1 to 36. On the other hand, at least one or both of the circuit formability and the disconnection rate was/were poor in any of Comparative Examples 1 to 34.

The invention claimed is:

1. A copper foil provided with a carrier comprising, in order, an intermediate layer and an ultrathin copper layer on one side or both sides of the carrier, wherein
   the ultrathin copper layer is an electrolytic copper layer; and
   a thickness of the ultrathin copper layer measured by using a gravimetric method is 1.5 μm or less and a number of pinholes in the ultrathin copper layer is 0 pinholes/m² or more and 5 pinholes/m² or less.

2. The copper foil provided with a carrier according to claim 1, wherein a thickness of the ultrathin copper layer measured by using the gravimetric method is 0.15 to 0.85 μm.

3. The copper foil provided with a carrier according to claim 1, wherein the ultrathin copper layer has a gloss copper plating layer.

4. The copper provided with a carrier according to claim 1 comprising:
   one or more layers selected from the group consisting of a roughened layer, a heat resistant layer, an anti-corrosion layer, a chromate-treated layer and a silane coupling-treated layer.

5. The copper foil provided with a carrier according to claim 4 comprising a resin layer provided above one or more layers selected from the group consisting of the roughened layer, the heat resistant layer, an anti-corrosion layer, a chromate-treated layer and a silane coupling-treated layer.

6. The copper foil provided with a carrier according to claim 4, wherein the roughened layer is a layer consisting of a simple substance or one or more said simple substances, the simple substance being selected from the group consisting of copper, nickel, cobalt, phosphorous, tungsten, arsenic, molybdenum, chromium and zinc.

7. The copper foil provided with a carrier according to claim 1 comprising a resin layer provided above the ultrathin copper layer.

8. A laminate fabricated by using the copper foil provided with a carrier according to claim 1.

9. A method for fabricating a printed wiring board comprising:
- a step of providing a resin layer and a circuit at least one time on one side or both sides of the laminate according to claim 8; and
- a step of, after the resin layer and the circuit have been formed, peeling the carrier or the ultrathin copper layer from the copper foil provided with a carrier constituting the laminate.

10. A printed wiring board comprising the copper foil provided with a carrier according to claim 1.

11. An electronic device comprising the printed wiring board according to claim 10.

12. A method for fabricating a printed wiring board comprising:
forming a copper-clad laminate by carrying out
- a step of preparing a copper foil provided with the carrier according to claim 1 and an insulating substrate,
- a step of laminating the copper foil provided with the carrier and the insulating substrate, and
- a step of, after the copper foil provided with the carrier and the insulating substrate have been laminated, peeling the carrier of the copper foil provided with the carrier; and
then forming a circuit by any of a semi-additive method, a subtractive method, a partly additive method, and a modified semi-additive method.

13. A method for fabricating a printed wiring board comprising:
- a step of forming a circuit on the ultrathin copper layer side surface or the carrier side surface of a copper foil provided with the carrier according to claim 1;
- a step of forming a resin layer on the ultrathin copper layer side surface or the carrier side surface of the copper foil provided with the carrier so that the circuit is buried;
- a step of forming a circuit on the resin layer;
- a step of peeling the carrier or the ultrathin copper layer after forming the circuit on the resin layer; and
- a step of exposing the circuit buried in the resin layer that is formed on the ultrathin copper layer side surface or the carrier side surface by, after the carrier or the ultrathin copper layer has been peeled off, removing the ultrathin copper layer or the carrier.

14. A method for fabricating a printed wiring board comprising:
- a step of laminating the ultrathin copper layer side surface and/or the carrier side surface of a copper foil provided with the carrier according to claim 1 and a resin substrate;
- a step of providing a resin layer and a circuit at least one time on the ultrathin copper layer side surface and/or the carrier side surface of the copper foil provided with the carrier opposite to a side with the resin substrate laminated thereon; and
- a step of, after the resin layer and the circuit have been formed, peeling the carrier or the ultrathin copper layer from the copper foil provided with the carrier.

15. A copper foil provided with a carrier comprising, in order, an intermediate layer and an ultrathin copper layer on one side or both sides of the carrier, wherein
the ultrathin copper layer is an electrolytic copper layer; and
a thickness of the ultrathin copper layer measured by using a gravimetric method is less than 1.0 µm and a number of pinholes in the ultrathin copper layer is 0 pinholes/m$^2$ or more and 10 pinholes/m$^2$ or less.

16. The copper foil provided with a carrier according to claim 15, wherein a thickness of the ultrathin copper layer measured by using the gravimetric method is 0.15 to 0.85 µm.

17. The copper foil provided with a carrier according to claim 16,
wherein a surface roughness Rt of the carrier on the side to be provided with the ultrathin copper layer is 1.5 µm or less, and
the surface roughness Rt is measured using a non-contact roughness meter in accordance with JIS B0601-2001.

18. The copper foil provided with a carrier according to claim 17, wherein the ultrathin copper layer has a gloss copper plating layer.

19. The copper foil provided with a carrier according to claim 15, wherein a number of pinholes in the ultrathin copper layer is 0 pinholes/m$^2$ or more and 5 pinholes/m$^2$ or less.

20. The copper foil provided with a carrier according to claim 15, wherein the ultrathin copper layer has a gloss copper plating layer.

21. The copper foil provided with a carrier according to claim 15 comprising:
one or more layers selected from the group consisting of a roughened layer, a heat resistant layer, an anti-corrosion layer, a chromate-treated layer and a silane coupling-treated layer.

22. The copper foil provided with a carrier according to claim 21 comprising a resin layer provided above one or more layers selected from the group consisting of the roughened layer, the heat resistant layer, an anti-corrosion layer, a chromate-treated layer and a silane coupling-treated layer.

23. A copper foil provided with a carrier comprising, in order, an intermediate layer and an ultrathin copper layer on one side or both sides of the carrier, wherein the ultrathin copper layer is an electrolytic copper layer; and
a thickness of the ultrathin copper layer measured by using a gravimetric method is 0.85 µm or less and a number of pinholes in the ultrathin copper layer is in a range of 0 pinholes/m$^2$ to 5 pinholes/m$^2$.

* * * * *

UNITED STATES PATENT AND TRADEMARK OFFICE
CERTIFICATE OF CORRECTION

PATENT NO. : 10,187,983 B2
APPLICATION NO. : 14/996768
DATED : January 22, 2019
INVENTOR(S) : Michiya Kohiki and Tomota Nagaura Page 1 of 1

It is certified that error appears in the above-identified patent and that said Letters Patent is hereby corrected as shown below:

In the Claims

In Claim 4, Column 74, Line 50, insert --foil-- after "copper"

Signed and Sealed this
Seventh Day of May, 2019

Andrei Iancu
*Director of the United States Patent and Trademark Office*